US007605009B2

(12) United States Patent
McAvoy et al.

(10) Patent No.: US 7,605,009 B2
(45) Date of Patent: Oct. 20, 2009

(54) METHOD OF FABRICATION MEMS INTEGRATED CIRCUITS

(75) Inventors: Gregory John McAvoy, Balmain (AU); Kia Silverbrook, Balmain (AU); Emma Rose Kerr, Balmain (AU); Misty Bagnat, Balmain (AU); Vincent Patrick Lawlor, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 158 days.

(21) Appl. No.: 11/763,444

(22) Filed: Jun. 15, 2007

(65) Prior Publication Data

US 2008/0227229 A1 Sep. 18, 2008

Related U.S. Application Data

(63) Continuation of application No. 11/685,084, filed on Mar. 12, 2007.

(51) Int. Cl.
*H01L 21/00* (2006.01)

(52) U.S. Cl. ........................................................ 438/21

(58) Field of Classification Search .................. 438/33, 438/68, 21

See application file for complete search history.

(56) References Cited

U.S. PATENT DOCUMENTS 6,573,156 B1 6/2003 Wang et al.
6,805,808 B2 * 10/2004 Fujii et al. .................... 216/52
6,846,692 B2 1/2005 Silverbrook et al.
7,022,546 B2 4/2006 Spooner et al.
7,104,632 B2 9/2006 Song et al.
7,153,716 B2 12/2006 Ikegami
7,163,640 B2 * 1/2007 Yeo et al. ...................... 216/27
2006/0221129 A1 10/2006 Silverbrook
2006/0221130 A1 10/2006 Silverbrook
2007/0148916 A1 * 6/2007 Noda ......................... 438/459

FOREIGN PATENT DOCUMENTS

EP 0882593 A1 12/1998
EP 1439064 B1 3/2007

* cited by examiner

*Primary Examiner*—W. David Coleman

(57) ABSTRACT

A method of fabricating a plurality of MEMS integrated circuits from a wafer having a MEMS layer formed on a frontside thereof and a polymer coating over said MEMS layer, said polymer coating having a plurality of frontside dicing streets defined therethrough, said method comprising the steps of:

(a) releasably attaching a first holding means to said polymer coating; and
(b) performing at least one operation on a backside of the wafer, said at least one operation including etching a plurality of backside dicing streets through the wafer, each backside dicing street meeting with a respective frontside dicing street, thereby providing the plurality of MEMS integrated circuits releasably attached to said first holding means, wherein each MEMS integrated circuit comprises a respective polymer coating.

21 Claims, 29 Drawing Sheets

METHOD OF FABRICATION MEMS INTEGRATED CIRCUITS

CROSS REFERENCE TO RELATED APPLICATION

This application is a continuation-in-part of, filed Ser. No. 11/685,084, Mar. 12, 2007, all of which is incorporated herein by reference.

FIELD OF THE INVENTION

The present invention relates to the field of printers and particularly inkjet printheads. It has been developed primarily to improve fabrications methods, print quality and reliability in high resolution printheads.

CROSS REFERENCE TO OTHER RELATED APPLICATIONS

The following applications have been filed by the Applicant simultaneously with this application:

| | | | |
|---|---|---|---|
| 11/763,440 | 11/763,442 | 11/763,446 | 11/763,443 |

The disclosures of these co-pending applications are incorporated herein by reference.

The following applications were filed by the Applicant simultaneously with the parent application, application Ser. No. 11/685,084:

| | |
|---|---|
| 11/685,086 | 11/685,090 |

The disclosures of these applications are incorporated herein by reference.

The following patents or patent applications filed by the applicant or assignee of the present invention are hereby incorporated by cross-reference.

| | | | | | |
|---|---|---|---|---|---|
| 6,405,055 | 6,628,430 | 7,136,186 | 7,286,260 | 7,145,689 | 7,130,075 |
| 7,081,974 | 7,177,055 | 7,209,257 | 7,161,715 | 7,154,632 | 7,158,258 |
| 7,148,993 | 7,075,684 | 11/635,526 | 11/650,545 | 11/653,241 | 11/653,240 |
| 7,241,005 | 7,108,437 | 6,915,140 | 6,999,206 | 7,136,198 | 7,092,130 |
| 6,750,901 | 6,476,863 | 6,788,336 | 7,249,108 | 6,566,858 | 6,331,946 |
| 6,246,970 | 6,442,525 | 7,346,586 | 09/505,951 | 6,374,354 | 7,246,098 |
| 6,816,968 | 6,757,832 | 6,334,190 | 6,745,331 | 7,249,109 | 7,197,642 |
| 7,093,139 | 10/636,263 | 10/636,283 | 10/866,608 | 7,210,038 | 7,401,223 |
| 10/940,653 | 10/942,858 | 11/706,329 | 7,170,652 | 6,967,750 | 6,995,876 |
| 7,099,051 | 11/107,942 | 7,193,734 | 11/209,711 | 11/599,336 | 7,095,533 |
| 6,914,686 | 7,161,709 | 7,099,033 | 7,364,256 | 7,258,417 | 7,293,853 |
| 7,328,968 | 7,270,395 | 11/003,404 | 11/003,419 | 7,334,864 | 7,255,419 |
| 7,284,819 | 7,229,148 | 7,258,416 | 7,273,263 | 7,270,393 | 6,984,017 |
| 7,347,526 | 7,357,477 | 11/003,463 | 7,364,255 | 7,357,476 | 11/003,614 |
| 7,284,820 | 7,341,328 | 7,246,875 | 7,322,669 | 11/293,800 | 11/293,802 |
| 11/293,801 | 11/293,808 | 11/293,809 | 11/482,975 | 11/482,970 | 11/482,968 |
| 11/482,972 | 11/482,971 | 11/482,969 | 11/518,238 | 11/518,280 | 11/518,244 |
| 11/518,243 | 11/518,242 | 11/246,676 | 11/246,677 | 11/246,678 | 11/246,679 |
| 11/246,680 | 11/246,681 | 11/246,714 | 7,425,051 | 7,399,057 | 11/246,671 |
| 11/246,670 | 11/246,669 | 11/246,704 | 11/246,710 | 11/246,688 | 7,399,054 |
| 7,425,049 | 7,367,648 | 7,370,936 | 7,401,886 | 11/246,708 | 7,401,887 |
| 7,384,119 | 7,401,888 | 7,387,358 | 7,413,281 | 11/482,958 | 11/482,955 |
| 11/482,962 | 11/482,963 | 11/482,956 | 11/482,954 | 11/482,974 | 11/482,957 |
| 11/482,987 | 11/482,959 | 11/482,960 | 11/482,961 | 11/482,964 | 11/482,965 |
| 11/482,976 | 11/482,973 | 11/495,815 | 11/495,816 | 11/495,817 | 6,227,652 |
| 6,213,588 | 6,213,589 | 6,231,163 | 6,247,795 | 6,394,581 | 6,244,691 |
| 6,257,704 | 6,416,168 | 6,220,694 | 6,257,705 | 6,247,794 | 6,234,610 |
| 6,247,793 | 6,264,306 | 6,241,342 | 6,247,792 | 6,264,307 | 6,254,220 |
| 6,234,611 | 6,302,528 | 6,283,582 | 6,239,821 | 6,338,547 | 6,247,796 |
| 6,557,977 | 6,390,603 | 6,362,843 | 6,293,653 | 6,312,107 | 6,227,653 |
| 6,234,609 | 6,238,040 | 6,188,415 | 6,227,654 | 6,209,989 | 6,247,791 |
| 6,336,710 | 6,217,153 | 6,416,167 | 6,243,113 | 6,283,581 | 6,247,790 |
| 6,260,953 | 6,267,469 | 6,588,882 | 6,742,873 | 6,918,655 | 6,547,371 |
| 6,938,989 | 6,598,964 | 6,923,526 | 6,273,544 | 6,309,048 | 6,420,196 |
| 6,443,558 | 6,439,689 | 6,378,989 | 6,848,181 | 6,634,735 | 6,299,289 |
| 6,299,290 | 6,425,654 | 6,902,255 | 6,623,101 | 6,406,129 | 6,505,916 |
| 6,457,809 | 6,550,895 | 6,457,812 | 7,152,962 | 6,428,133 | 7,216,956 |
| 7,080,895 | 11/144,844 | 7,182,437 | 7,357,485 | 7,387,368 | 11/607,976 |
| 11/607,975 | 11/607,999 | 11/607,980 | 11/607,979 | 11/607,978 | 7,416,280 |
| 7,252,366 | 10/683,064 | 7,360,865 | 11/482,980 | 11/563,684 | 11/482,967 |
| 11/482,966 | 11/482,988 | 11/482,989 | 11/293,832 | 11/293,838 | 11/293,825 |
| 11/293,841 | 11/293,799 | 11/293,796 | 11/293,797 | 11/293,798 | 11/124,158 |
| 11/124,196 | 11/124,199 | 11/124,162 | 11/124,202 | 11/124,197 | 11/124,154 |
| 11/124,198 | 7,284,921 | 11/124,151 | 7,407,257 | 11/124,192 | 11/124,175 |
| 7,392,950 | 11/124,149 | 7,360,880 | 11/124,173 | 11/124,155 | 7,236,271 |
| 11/124,174 | 11/124,194 | 11/124,164 | 11/124,200 | 11/124,195 | 11/124,166 |
| 11/124,150 | 11/124,172 | 11/124,165 | 11/124,186 | 11/124,185 | 11/124,184 |
| 11/124,182 | 11/124,201 | 11/124,171 | 11/124,181 | 11/124,161 | 11/124,156 |
| 11/124,191 | 11/124,159 | 11/124,176 | 7,370,932 | 7,404,616 | 11/124,187 |
| 11/124,189 | 11/124,190 | 11/124,180 | 11/124,193 | 11/124,183 | 11/124,178 |
| 11/124,177 | 11/124,148 | 7,431,449 | 11/124,167 | 11/124,179 | 11/124,169 |

-continued

| | | | | | |
|---|---|---|---|---|---|
| 11/187,976 | 11/188,011 | 11/188,014 | 11/482,979 | 11/228,540 | 11/228,500 |
| 11/228,501 | 11/228,530 | 11/228,490 | 11/228,531 | 11/228,504 | 11/228,533 |
| 11/228,502 | 11/228,507 | 11/228,482 | 11/228,505 | 11/228,497 | 11/228,487 |
| 11/228,529 | 11/228,484 | 11/228,489 | 11/228,518 | 11/228,536 | 11/228,496 |
| 11/228,488 | 11/228,506 | 11/228,516 | 11/228,526 | 11/228,539 | 11/228,538 |
| 11/228,524 | 11/228,523 | 11/228,519 | 11/228,528 | 11/228,527 | 7,403,797 |
| 11/228,520 | 11/228,498 | 11/228,511 | 11/228,522 | 11/228,515 | 11/228,537 |
| 11/228,534 | 11/228,491 | 11/228,499 | 11/228,509 | 11/228,492 | 11/228,493 |
| 11/228,510 | 11/228,508 | 11/228,512 | 11/228,514 | 11/228,494 | 11/228,495 |
| 11/228,486 | 11/228,481 | 11/228,477 | 7,357,311 | 7,380,709 | 7,428,986 |
| 7,403,796 | 7,407,092 | 11/228,513 | 11/228,503 | 11/228,480 | 11/228,535 |
| 11/228,478 | 11/228,479 | 6,238,115 | 6,386,535 | 6,398,344 | 6,612,240 |
| 6,752,549 | 6,805,049 | 6,971,313 | 6,899,480 | 6,860,664 | 6,925,935 |
| 6,966,636 | 7,024,995 | 7,284,852 | 6,926,455 | 7,056,038 | 6,869,172 |
| 7,021,843 | 6,988,845 | 6,964,533 | 6,981,809 | 7,284,822 | 7,258,067 |
| 7,322,757 | 7,222,941 | 7,284,925 | 7,278,795 | 7,249,904 | 7,152,972 |
| 11/592,996 | 6,746,105 | 11/246,687 | 11/246,718 | 7,322,681 | 11/246,686 |
| 11/246,703 | 11/246,691 | 11/246,711 | 11/246,690 | 11/246,712 | 11/246,717 |
| 7,401,890 | 7,401,910 | 11/246,701 | 11/246,702 | 7,431,432 | 11/246,697 |
| 11/246,698 | 11/246,699 | 11/246,675 | 11/246,674 | 11/246,667 | 7,156,508 |
| 7,159,972 | 7,083,271 | 7,165,834 | 7,080,894 | 7,201,469 | 7,090,336 |
| 7,156,489 | 7,413,283 | 10/760,246 | 7,083,257 | 7,258,422 | 7,255,423 |
| 7,219,980 | 10/760,253 | 7,416,274 | 7,367,649 | 7,118,192 | 10/760,194 |
| 7,322,672 | 7,077,505 | 7,198,354 | 7,077,504 | 10/760,189 | 7,198,355 |
| 7,401,894 | 7,322,676 | 7,152,959 | 7,213,906 | 7,178,901 | 7,222,938 |
| 7,108,353 | 7,104,629 | 11/446,227 | 7,370,939 | 7,429,095 | 7,404,621 |
| 7,261,401 | 11/474,279 | 11/482,939 | 7,328,972 | 7,322,673 | 7,306,324 |
| 7,306,325 | 11/603,824 | 7,399,071 | 11/601,672 | 7,303,261 | 11/653,253 |
| 11/706,328 | 11/706,299 | 7,399,053 | 7,303,930 | 11/246,672 | 7,401,405 |
| 11/246,683 | 11/246,682 | 7,246,886 | 7,128,400 | 7,108,355 | 6,991,322 |
| 7,287,836 | 7,118,197 | 10/728,784 | 7,364,269 | 7,077,493 | 6,962,402 |
| 10/728,803 | 7,147,308 | 10/728,779 | 7,118,198 | 7,168,790 | 7,172,270 |
| 7,229,155 | 6,830,318 | 7,195,342 | 7,175,261 | 10/773,183 | 7,108,356 |
| 7,118,202 | 10/773,186 | 7,134,744 | 10/773,185 | 7,134,743 | 7,182,439 |
| 7,210,768 | 10/773,187 | 7,134,745 | 7,156,484 | 7,118,201 | 7,111,926 |
| 7,431,433 | 7,018,021 | 7,401,901 | 11/060,805 | 11/188,017 | 7,128,402 |
| 7,387,369 | 11/329,157 | 11/490,041 | 11/501,767 | 7,284,839 | 7,246,885 |
| 7,229,156 | 11/505,846 | 11/505,857 | 7,293,858 | 11/524,908 | 11/524,938 |
| 7,258,427 | 11/524,912 | 7,278,716 | 11/592,995 | 11/603,825 | 11/649,773 |
| 11/650,549 | 11/653,237 | 11/097,308 | 11/097,309 | 7,246,876 | 7,431,431 |
| 7,419,249 | 7,377,623 | 7,328,978 | 7,334,876 | 7,147,306 | 7,261,394 |
| 11/482,953 | 11/482,977 | 11/544,778 | 11/544,779 | 09/575,197 | 7,079,712 |
| 6,825,945 | 7,330,974 | 6,813,039 | 6,987,506 | 7,038,797 | 6,980,318 |
| 6,816,274 | 7,102,772 | 7,350,236 | 6,681,045 | 6,728,000 | 7,173,722 |
| 7,088,459 | 09/575,181 | 7,068,382 | 7,062,651 | 6,789,194 | 6,789,191 |
| 6,644,642 | 6,502,614 | 6,622,999 | 6,669,385 | 6,549,935 | 6,987,573 |
| 6,727,996 | 6,591,884 | 6,439,706 | 6,760,119 | 7,295,332 | 6,290,349 |
| 6,428,155 | 6,785,016 | 6,870,966 | 6,822,639 | 6,737,591 | 7,055,739 |
| 7,233,320 | 6,830,196 | 6,832,717 | 6,957,768 | 09/575,172 | 7,170,499 |
| 7,106,888 | 7,123,239 | 10/727,181 | 10/727,162 | 7,377,608 | 7,399,043 |
| 7,121,639 | 7,165,824 | 7,152,942 | 10/727,157 | 7,181,572 | 7,096,137 |
| 7,302,592 | 7,278,034 | 7,188,282 | 10/727,159 | 10/727,180 | 10/727,179 |
| 10/727,192 | 10/727,274 | 10/727,164 | 10/727,161 | 10/727,198 | 10/727,158 |
| 10/754,536 | 10/754,938 | 10/727,160 | 10/934,720 | 7,171,323 | 7,278,697 |
| 7,360,131 | 11/488,853 | 7,328,115 | 7,369,270 | 6,795,215 | 7,070,098 |
| 7,154,638 | 6,805,419 | 6,859,289 | 6,977,751 | 6,398,332 | 6,394,573 |
| 6,622,923 | 6,747,760 | 6,921,144 | 10/884,881 | 7,092,112 | 7,192,106 |
| 11/039,866 | 7,173,739 | 6,986,560 | 7,008,033 | 11/148,237 | 7,222,780 |
| 7,270,391 | 11/478,599 | 7,388,689 | 11/481,981 | 7,195,328 | 7,182,422 |
| 11/650,537 | 11/712,540 | 7,374,266 | 7,427,117 | 10/854,488 | 7,281,330 |
| 10/854,503 | 7,328,956 | 10/854,509 | 7,188,928 | 7,093,989 | 7,377,609 |
| 10/854,495 | 10/854,498 | 10/854,511 | 7,390,071 | 10/854,525 | 10/854,526 |
| 10/854,516 | 7,252,353 | 10/854,515 | 7,267,417 | 10/854,505 | 10/854,493 |
| 7,275,805 | 7,314,261 | 10/854,490 | 7,281,777 | 7,290,852 | 10/854,528 |
| 10/854,523 | 10/854,527 | 10/854,524 | 10/854,520 | 10/854,514 | 10/854,519 |
| 10/854,513 | 10/854,499 | 10/854,501 | 7,266,661 | 7,243,193 | 10/854,518 |
| 10/854,517 | 10/934,628 | 7,163,345 | 7,322,666 | 11/601,757 | 11/706,295 |
| 11/544,764 | 11/544,765 | 11/544,772 | 11/544,773 | 11/544,774 | 11/544,775 |
| 7,425,048 | 11/544,766 | 11/544,767 | 7,384,128 | 11/544,770 | 11/544,769 |
| 11/544,777 | 7,425,047 | 7,413,288 | 11/293,804 | 11/293,840 | 11/293,803 |
| 11/293,833 | 11/293,834 | 11/293,835 | 11/293,836 | 11/293,837 | 11/293,792 |
| 11/293,794 | 11/293,839 | 11/293,826 | 11/293,829 | 11/293,830 | 11/293,827 |
| 11/293,828 | 7,270,494 | 11/293,823 | 11/293,824 | 11/293,831 | 11/293,815 |
| 11/293,819 | 11/293,818 | 11/293,817 | 11/293,816 | 11/482,978 | 11/640,356 |
| 11/640,357 | 11/640,358 | 11/640,359 | 11/640,360 | 11/640,355 | 11/679,786 |
| 10/760,254 | 7,425,050 | 7,364,263 | 7,201,468 | 7,360,868 | 10/760,249 |
| 7,234,802 | 7,303,255 | 7,287,846 | 7,156,511 | 10/760,264 | 7,258,432 |
| 7,097,291 | 10/760,222 | 10/760,248 | 7,083,273 | 7,367,647 | 7,374,355 |
| 10/760,204 | 10/760,205 | 10/760,206 | 10/760,267 | 10/760,270 | 7,198,352 |

-continued

| | | | | | |
|---|---|---|---|---|---|
| 7,364,264 | 7,303,251 | 7,201,470 | 7,121,655 | 7,293,861 | 7,232,208 |
| 7,328,985 | 7,344,232 | 7,083,272 | 7,311,387 | 11/583,874 | 7,303,258 |
| 11/706,322 | 11/706,968 | 11/014,764 | 11/014,763 | 7,331,663 | 7,360,861 |
| 7,328,973 | 7,427,121 | 7,407,262 | 7,303,252 | 7,249,822 | 11/014,762 |
| 7,311,382 | 7,360,860 | 7,364,257 | 7,390,075 | 7,350,896 | 7,429,096 |
| 7,384,135 | 7,331,660 | 7,416,287 | 11/014,737 | 7,322,684 | 7,322,685 |
| 7,311,381 | 7,270,405 | 7,303,268 | 11/014,735 | 7,399,072 | 7,393,076 |
| 11/014,750 | 11/014,749 | 7,249,833 | 11/014,769 | 11/014,729 | 7,331,661 |
| 11/014,733 | 7,300,140 | 7,357,492 | 7,357,493 | 11/014,766 | 7,380,902 |
| 7,284,816 | 7,284,845 | 7,255,430 | 7,390,080 | 7,328,984 | 7,350,913 |
| 7,322,671 | 7,380,910 | 7,431,424 | 11/014,716 | 11/014,732 | 7,347,534 |
| 11/097,268 | 11/097,185 | 7,367,650 | 11/293,820 | 11/293,813 | 11/293,822 |
| 11/293,812 | 7,357,496 | 11/293,814 | 7,431,440 | 7,431,443 | 11/293,811 |
| 11/293,807 | 11/293,806 | 11/293,805 | 11/293,810 | 11/482,982 | 11/482,983 |
| 11/482,984 | 11/495,818 | 11/495,819 | 11/677,049 | 11/677,050 | 7,079,292 |

BACKGROUND OF THE INVENTION

Many different types of printing have been invented, a large number of which are presently in use. The known forms of print have a variety of methods for marking the print media with a relevant marking media. Commonly used forms of printing include offset printing, laser printing and copying devices, dot matrix type impact printers, thermal paper printers, film recorders, thermal wax printers, dye sublimation printers and ink jet printers both of the drop on demand and continuous flow type. Each type of printer has its own advantages and problems when considering cost, speed, quality, reliability, simplicity of construction and operation etc.

In recent years, the field of ink jet printing, wherein each individual pixel of ink is derived from one or more ink nozzles has become increasingly popular primarily due to its inexpensive and versatile nature.

Many different techniques on ink jet printing have been invented. For a survey of the field, reference is made to an article by J Moore, "Non-Impact Printing: Introduction and Historical Perspective", Output Hard Copy Devices, Editors R Dubeck and S Sherr, pages 207-220 (1988).

Ink Jet printers themselves come in many different types. The utilization of a continuous stream of ink in ink jet printing appears to date back to at least 1929 wherein U.S. Pat. No. 1,941,001 by Hansell discloses a simple form of continuous stream electro-static ink jet printing.

U.S. Pat. No. 3,596,275 by Sweet also discloses a process of a continuous ink jet printing including the step wherein the ink jet stream is modulated by a high frequency electro-static field so as to cause drop separation. This technique is still utilized by several manufacturers including Elmjet and Scitex (see also U.S. Pat. No. 3,373,437 by Sweet et al)

Piezoelectric ink jet printers are also one form of commonly utilized ink jet printing device. Piezoelectric systems are disclosed by Kyser et. al. in U.S. Pat. No. 3,946,398 (1970) which utilizes a diaphragm mode of operation, by Zolten in U.S. Pat. No. 3,683,212 (1970) which discloses a squeeze mode of operation of a piezoelectric crystal, Stemme in U.S. Pat. No. 3,747,120 (1972) discloses a bend mode of piezoelectric operation, Howkins in U.S. Pat. No. 4,459,601 discloses a piezoelectric push mode actuation of the ink jet stream and Fischbeck in U.S. Pat. No. 4,584,590 which discloses a shear mode type of piezoelectric transducer element.

Recently, thermal inkjet printing has become an extremely popular form of ink jet printing. The ink jet printing techniques include those disclosed by Endo et al in GB 2007162 (1979) and Vaught et al in U.S. Pat. No. 4,490,728. Both the aforementioned references disclosed ink jet printing techniques that rely upon the activation of an electrothermal actuator which results in the creation of a bubble in a constricted space, such as a nozzle, which thereby causes the ejection of ink from an aperture connected to the confined space onto a relevant print media. Printing devices utilizing the electro-thermal actuator are manufactured by manufacturers such as Canon and Hewlett Packard.

As can be seen from the foregoing, many different types of printing technologies are available. Ideally, a printing technology should have a number of desirable attributes. These include inexpensive construction and operation, high speed operation, safe and continuous long term operation etc. Each technology may have its own advantages and disadvantages in the areas of cost, speed, quality, reliability, power usage, simplicity of construction operation, durability and consumables.

In the construction of any inkjet printing system, there are a considerable number of important factors which must be traded off against one another especially as large scale printheads are constructed, especially those of a pagewidth type. A number of these factors are outlined below.

Firstly, inkjet printheads are normally constructed utilizing micro-electromechanical systems (MEMS) techniques. As such, they tend to rely upon standard integrated circuit construction/fabrication techniques of depositing planar layers on a silicon wafer and etching certain portions of the planar layers. Within silicon circuit fabrication technology, certain techniques are better known than others. For example, the techniques associated with the creation of CMOS circuits are likely to be more readily used than those associated with the creation of exotic circuits including ferroelectrics, gallium arsenide etc. Hence, it is desirable, in any MEMS constructions, to utilize well proven semi-conductor fabrication techniques which do not require any "exotic" processes or materials. Of course, a certain degree of trade off will be undertaken in that if the advantages of using the exotic material far out weighs its disadvantages then it may become desirable to utilize the material anyway. However, if it is possible to achieve the same, or similar, properties using more common materials, the problems of exotic materials can be avoided.

A desirable characteristic of inkjet printheads would be a hydrophobic ink ejection face ("front face" or "nozzle face"), preferably in combination with hydrophilic nozzle chambers and ink supply channels. Hydrophilic nozzle chambers and ink supply channels provide a capillary action and are therefore optimal for priming and for re-supply of ink to nozzle chambers after each drop ejection. A hydrophobic front face minimizes the propensity for ink to flood across the front face of the printhead. With a hydrophobic front face, the aqueous inkjet ink is less likely to flood sideways out of the nozzle openings. Furthermore, any ink which does flood from nozzle openings is less likely to spread across the face and mix on the front face—they will instead form discrete spheric micro-droplets which can be managed more easily by suitable maintenance operations.

However, whilst hydrophobic front faces and hydrophilic ink chambers are desirable, there is a major problem in fabricating such printheads by MEMS techniques. The final stage of MEMS printhead fabrication is typically ashing of photoresist using an oxygen plasma. However, organic, hydrophobic materials deposited onto the front face are typically removed by the ashing process to leave a hydrophilic surface. Moreover, a problem with post-ashing vapour deposition of hydrophobic materials is that the hydrophobic material will be deposited inside nozzle chambers as well as on the front face of the printhead. The nozzle chamber walls become hydrophobized, which is highly undesirable in terms of generating a positive ink pressure biased towards the nozzle chambers. This is a conundrum, which creates significant demands on printhead fabrication.

Accordingly, it would be desirable to provide a printhead fabrication process, in which the resultant printhead has improved surface characteristics, without compromising the surface characteristics of nozzle chambers. It would further be desirable to provide a printhead fabrication process, in which the resultant printhead has a hydrophobic front face in combination with hydrophilic nozzle chambers.

SUMMARY OF THE INVENTION

In a first aspect the present invention provides a method of fabricating a plurality of MEMS integrated circuits from a wafer having a MEMS layer formed on a frontside thereof and a polymer coating over said MEMS layer, said polymer coating having a plurality of frontside dicing streets defined therethrough, said method comprising the steps of:

(a) releasably attaching a first holding means to said polymer coating; and (b) performing at least one operation on a backside of the wafer, said at least one operation including etching a plurality of backside dicing streets through the wafer, each backside dicing street meeting with a respective frontside dicing street, thereby providing the plurality of MEMS integrated circuits releasably attached to said first holding means, wherein each MEMS integrated circuit comprises a respective polymer coating.

Optionally, said polymer coating is resistant to removal by an oxidative plasma.

In another aspect the present invention provides a method of fabricating a plurality of MEMS integrated circuits from a wafer having a MEMS layer formed on a frontside thereof and a polymer coating over said MEMS layer, said polymer coating having a plurality of frontside dicing streets defined therethrough, said method comprising the steps of:

(a) releasably attaching a first holding means to said polymer coating; and (b) performing at least one operation on a backside of the wafer, said at least one operation including etching a plurality of backside dicing streets through the wafer, each backside dicing street meeting with a respective frontside dicing street, thereby providing the plurality of MEMS integrated circuits releasably attached to said first holding means, wherein each MEMS integrated circuit comprises a respective polymer coating, and wherein said polymer coating is resistant to removal by an oxidative plasma, and includes the step of subjecting said wafer to an oxidative plasma for removing sacrificial material in the MEMS layer.

Optionally, said polymer coating is hydrophobic.

Optionally, the polymer coating has a Young's modulus of less than 1000 MPa.

Optionally, said polymer coating is photopatternable.

Optionally, said polymer coating is comprised of a polymer selected from the group comprising: polymerized siloxanes and fluorinated polyolefins.

Optionally, the polymer is selected from the group comprising: polydimethylsiloxane (PDMS) and perfluorinated polyethylene (PFPE).

Optionally, said MEMS layer comprises a plurality of inkjet nozzle assemblies, and said method provides a plurality of printhead integrated circuits.

Optionally, said polymer coating has a plurality of nozzle openings defined therethrough, each of said nozzle openings being aligned with a nozzle opening of a respective inkjet nozzle assembly.

Optionally, step (b) comprises performing at least one operation selected from the group comprising:

backside wafer thinning;

backside etching of ink supply channels to provide a fluidic connection between said backside and said inkjet nozzle assemblies; and subjecting said backside to an oxidative plasma.

Optionally, said backside wafer thinning comprises one or more of:

wafer grinding; and plasma etching.

Optionally, said first holding means is releasably attached by means of an adhesive tape.

Optionally, said adhesive tape is a UV release tape or a thermal release tape.

Optionally, said first holding means is a handle wafer.

In another aspect the present invention provides a method of fabricating a plurality of MEMS integrated circuits from a wafer having a MEMS layer formed on a frontside thereof and a polymer coating over said MEMS layer, said polymer coating having a plurality of frontside dicing streets defined therethrough, said method comprising the steps of:

(a) releasably attaching a first holding means to said polymer coating; and (b) performing at least one operation on a backside of the wafer, said at least one operation including etching a plurality of backside dicing streets through the wafer, each backside dicing street meeting with a respective frontside dicing street, thereby providing the plurality of MEMS integrated circuits releasably attached to said first holding means, wherein each MEMS integrated circuit comprises a respective polymer coating, and further comprising the step of removing said integrated circuits from said first holding means.

In a further aspect the present invention provides a method of fabricating a plurality of MEMS integrated circuits comprising the further steps of:

(c) releasably attaching a second holding means to said backside of the wafer; and (d) removing the first holding means to provide the plurality of MEMS integrated circuits releasably attached to said second holding means.

Optionally, said frontside is subjected to said oxidative plasma after step (d).

Optionally, said second holding means is selected from the group comprising: a handle wafer and a wafer film frame.

In another aspect the present invention provides a method of fabricating a plurality of MEMS integrated circuits from a wafer having a MEMS layer formed on a frontside thereof, said method comprising the steps of:

(a) applying a polymer coating over said MEMS layer;

(b) defining a plurality of frontside dicing streets through said polymer coating;

(c) releasably attaching a first holding means to said polymer coating; and (d) performing at least one operation on a backside of the wafer, said at least one operation including etching a plurality of backside dicing streets through the wafer, each backside dicing street meeting with a respective frontside dicing street, thereby providing the plurality of MEMS integrated circuits releasably attached to said first holding means, wherein each MEMS integrated circuit comprises a protective polymer coating.

BRIEF DESCRIPTION OF THE DRAWINGS

Optional embodiments of the present invention will now be described by way of example only with reference to the accompanying drawings, in which.

DESCRIPTION OF OPTIONAL EMBODIMENTS

The present invention may be used with any type of printhead. The present Applicant has previously described a plethora of inkjet printheads. It is not necessary to describe all such printheads here for an understanding of the present invention. However, the present invention will now be described in connection with a thermal bubble-forming inkjet printhead and a mechanical thermal bend actuated inkjet printhead. Advantages of the present invention will be readily apparent from the discussion that follows.

Thermal Bubble-Forming Inkjet Printhead

Figure 1:
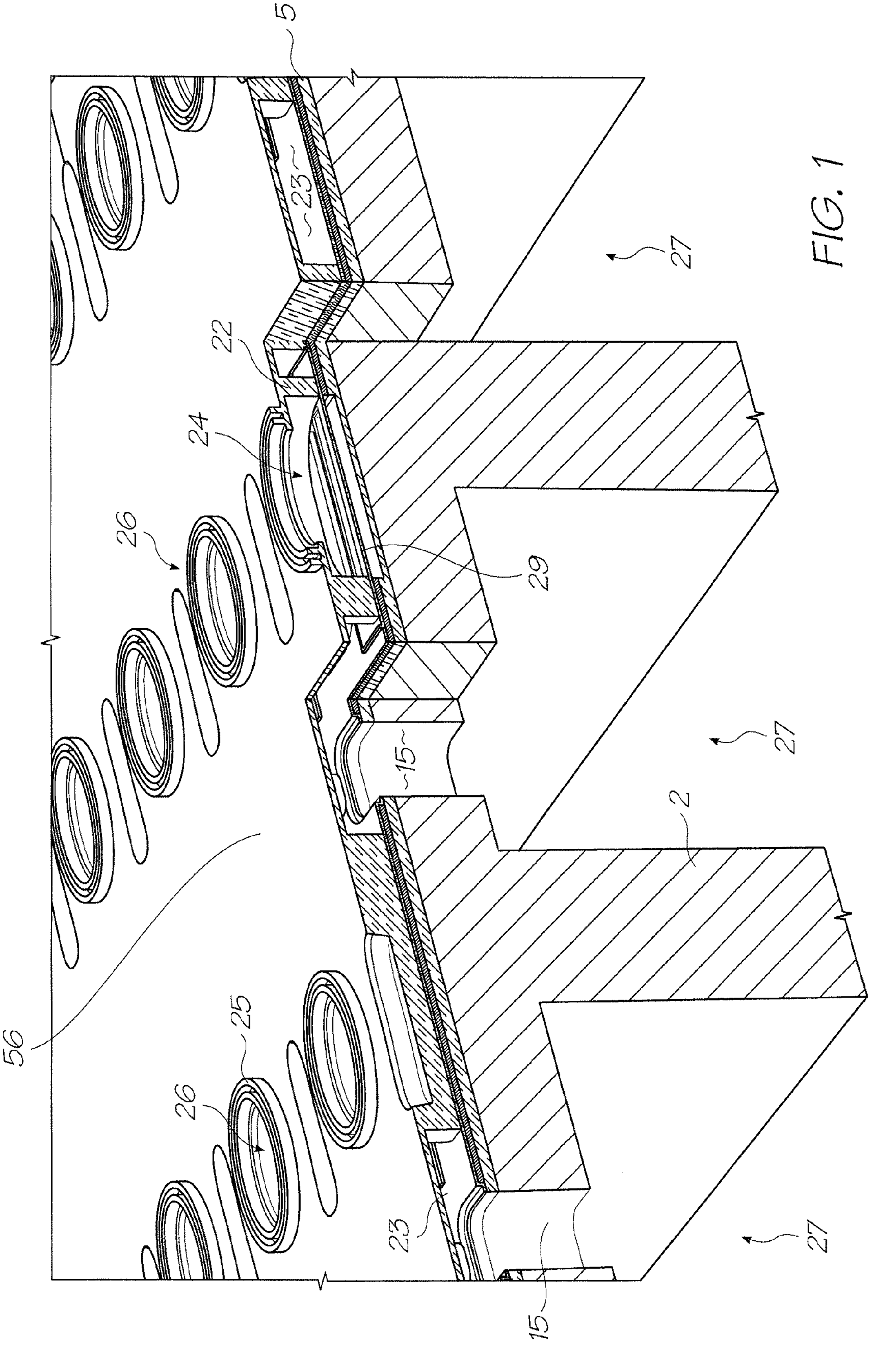
FIG. 1 is a partial perspective view of an array of nozzle assemblies of a thermal inkjet printhead.
Figure 2:
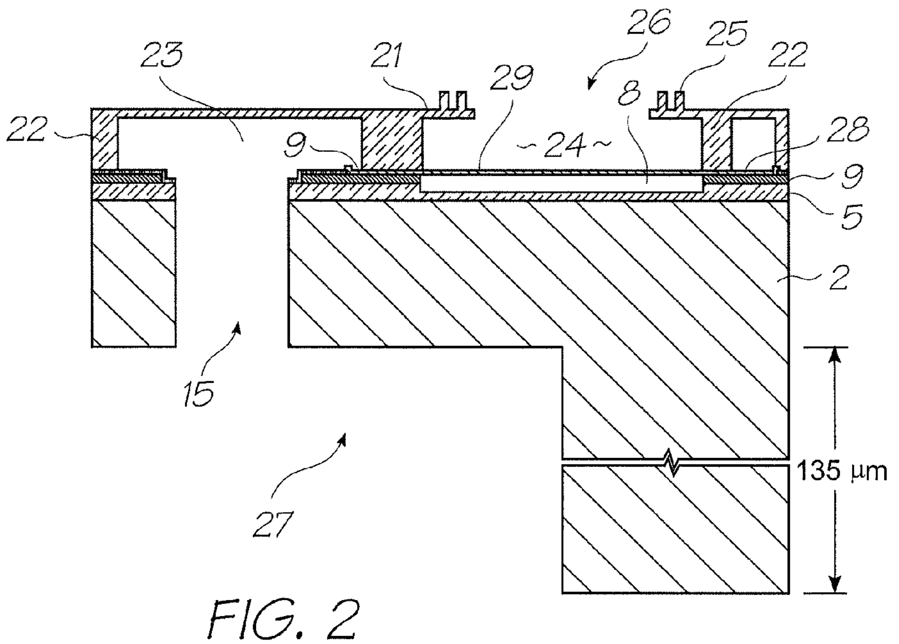
FIG. 2 is a side view of a nozzle assembly unit cell shown in FIG. 1.
Figure 3:
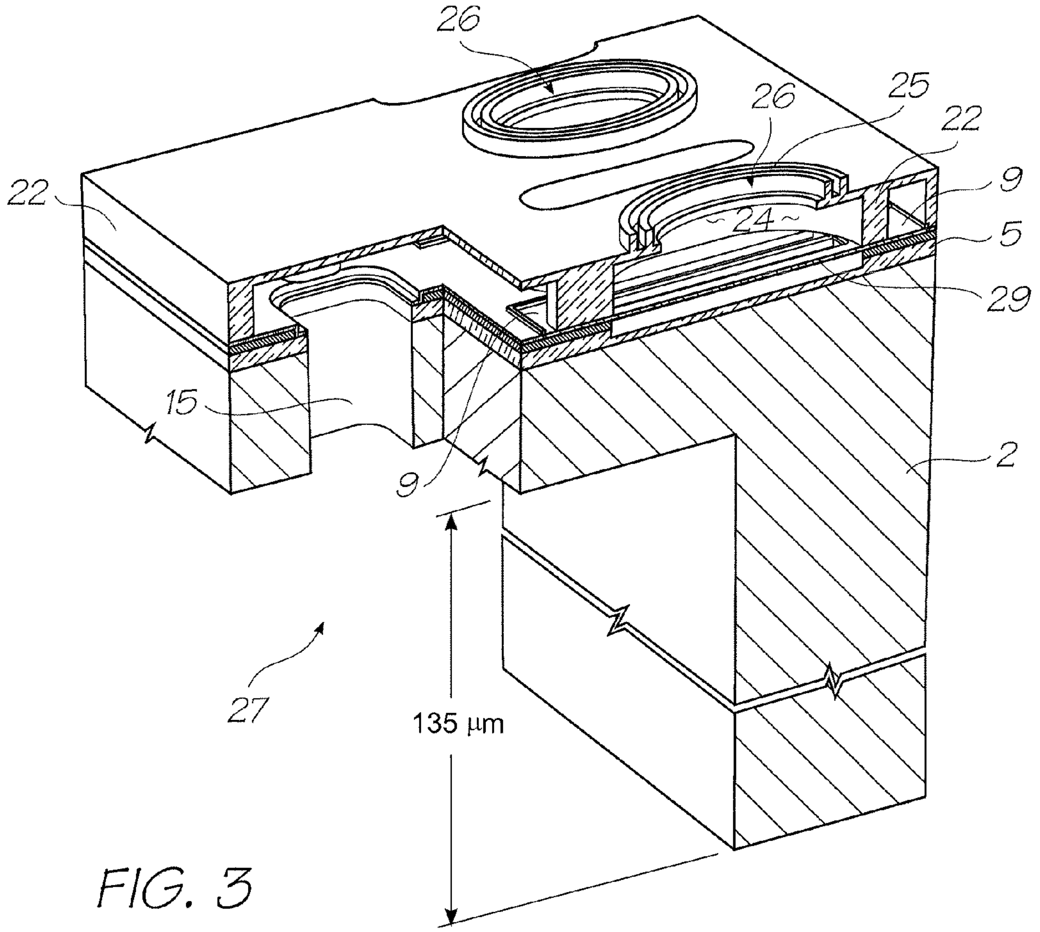
FIG. 3 is a perspective of the nozzle assembly shown in FIG. 2.

Referring to FIG. 1, there is shown a part of printhead comprising a plurality of nozzle assemblies. FIGS. 2 and 3 show one of these nozzle assemblies in side-section and cutaway perspective views.

Each nozzle assembly comprises a nozzle chamber 24 formed by MEMS fabrication techniques on a silicon wafer substrate 2. The nozzle chamber 24 is defined by a roof 21 and sidewalls 22 which extend from the roof 21 to the silicon substrate 2. As shown in FIG. 1, each roof is defined by part of a nozzle plate 56, which spans across an ejection face of the printhead. The nozzle plate 56 and sidewalls 22 are formed of the same material, which is deposited by PECVD over a sacrificial scaffold of photoresist during MEMS fabrication. Typically, the nozzle plate 56 and sidewalls 21 are formed of a ceramic material, such as silicon dioxide or silicon nitride. These hard materials have excellent properties for printhead robustness, and their inherently hydrophilic nature is advantageous for supplying ink to the nozzle chambers 24 by capillary action. However, the exterior (ink ejection) surface of the nozzle plate 56 is also hydrophilic, which causes any flooded ink on the surface to spread.

Returning to the details of the nozzle chamber 24, it will be seen that a nozzle opening 26 is defined in a roof of each nozzle chamber 24. Each nozzle opening 26 is generally elliptical and has an associated nozzle rim 25. The nozzle rim 25 assists with drop directionality during printing as well as reducing, at least to some extent, ink flooding from the nozzle opening 26. The actuator for ejecting ink from the nozzle chamber 24 is a heater element 29 positioned beneath the nozzle opening 26 and suspended across a pit 8. Current is supplied to the heater element 29 via electrodes 9 connected to drive circuitry in underlying CMOS layers of the substrate 2. When a current is passed through the heater element 29, it rapidly superheats surrounding ink to form a gas bubble, which forces ink through the nozzle opening. By suspending the heater element 29, it is completely immersed in ink when the nozzle chamber 24 is primed. This improves printhead efficiency, because less heat dissipates into the underlying substrate 2 and more input energy is used to generate a bubble.

As seen most clearly in FIG. 1, the nozzles are arranged in rows and an ink supply channel 27 extending longitudinally along the row supplies ink to each nozzle in the row. The ink supply channel 27 delivers ink to an ink inlet passage 15 for each nozzle, which supplies ink from the side of the nozzle opening 26 via an ink conduit 23 in the nozzle chamber 24.

The MEMS fabrication process for manufacturing such printheads was described in detail in our previously filed U.S. application Ser. No. 11/246,684 filed on Oct. 11, 2005, the contents of which is herein incorporated by reference. The latter stages of this fabrication process are briefly revisited here for the sake of clarity.

Figure 4:
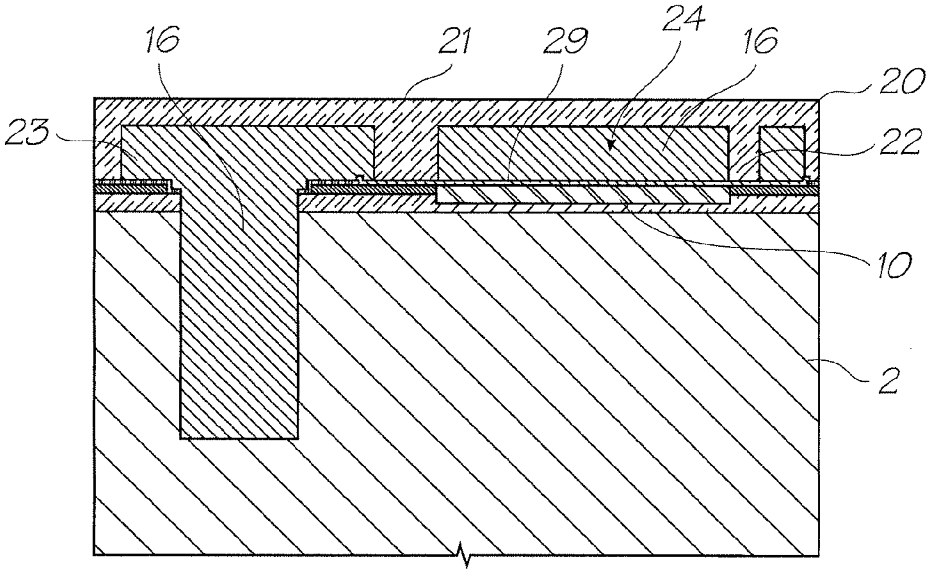
FIG. 4 shows a partially-formed nozzle assembly after deposition of side walls and roof material onto a sacrificial photoresist layer.
Figure 5:
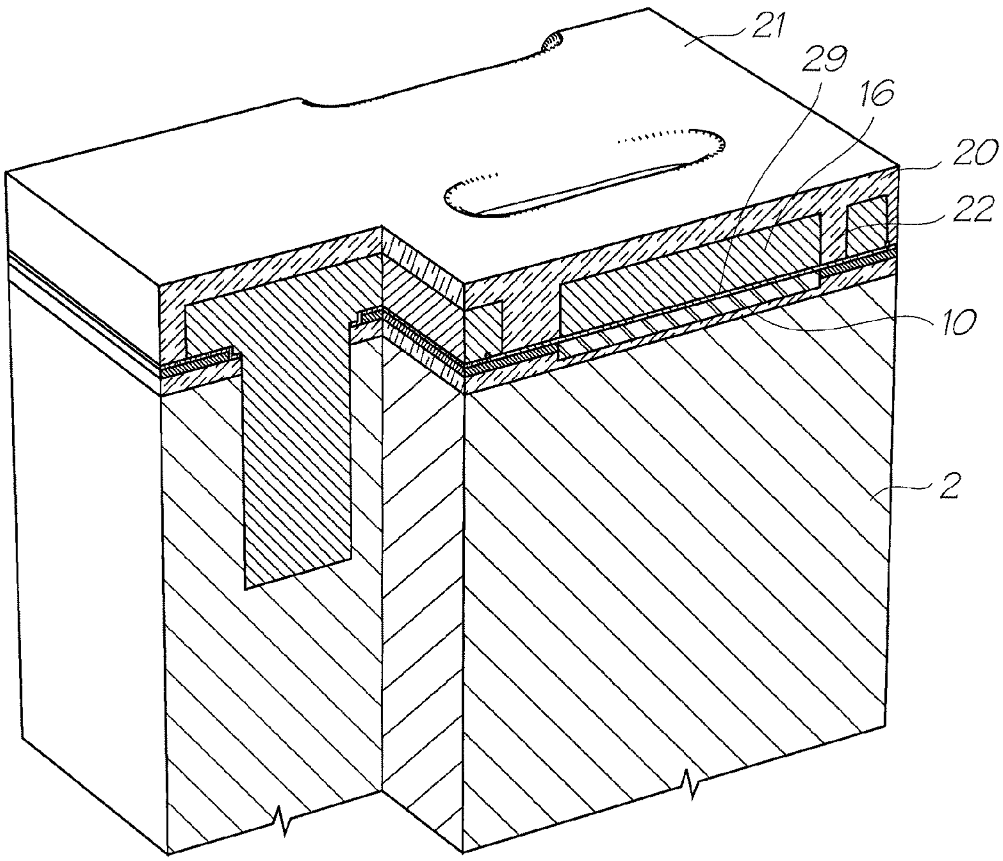
FIG. 5 is a perspective of the nozzle assembly shown in FIG. 4.

FIGS. 4 and 5 show a partially-fabricated printhead comprising a nozzle chamber 24 encapsulating sacrificial photoresist 10 (“SAC1”) and 16 (“SAC2”). The SAC1 photoresist 10 was used as a scaffold for deposition of heater material to form the suspended heater element 29. The SAC2 photoresist 16 was used as a scaffold for deposition of the sidewalls 22 and roof 21 (which defines part of the nozzle plate 56).

Figure 6:
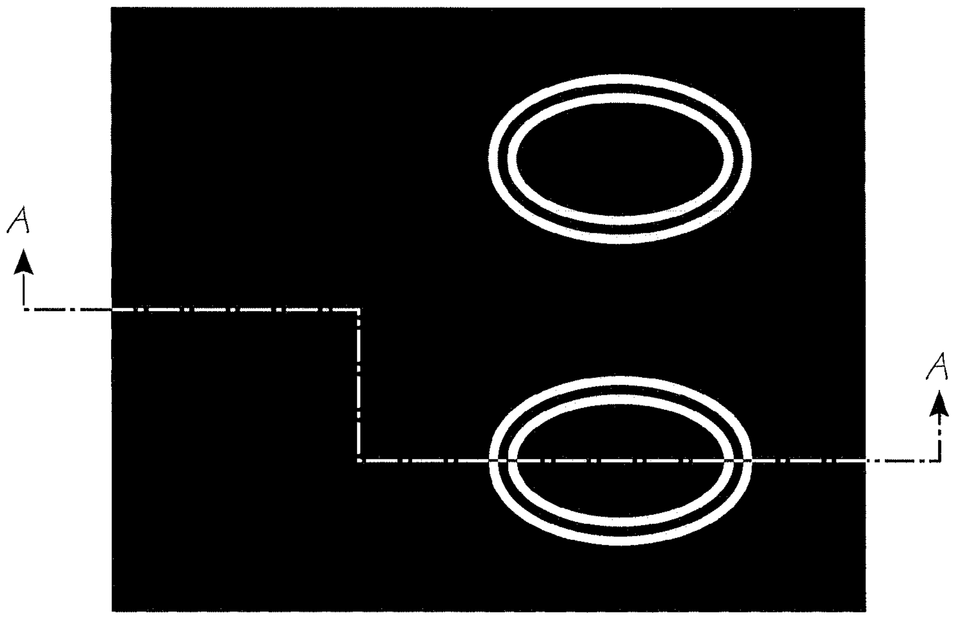
FIG. 6 is the mask associated with the nozzle rim etch shown in FIG. 7.
Figure 7:
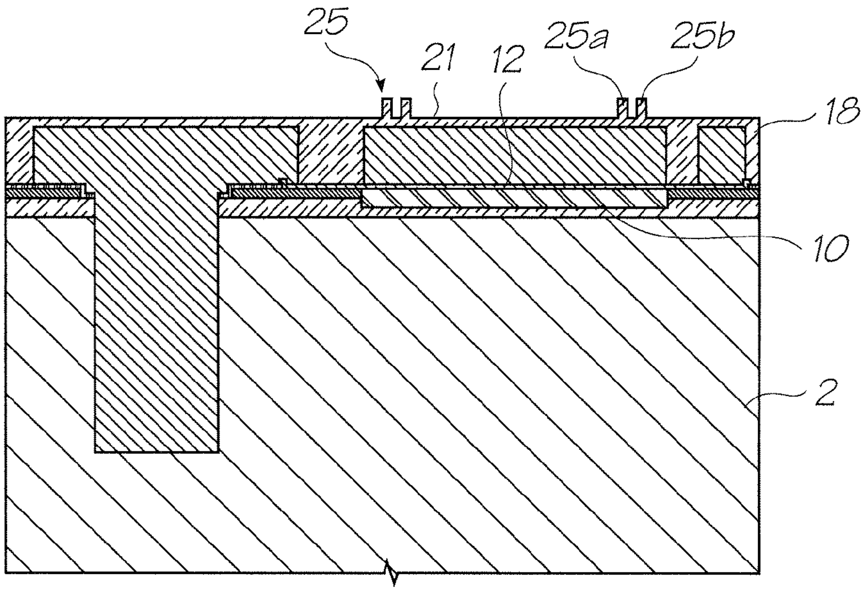
FIG. 7 shows the etch of the roof layer to form the nozzle opening rim.
Figure 8:
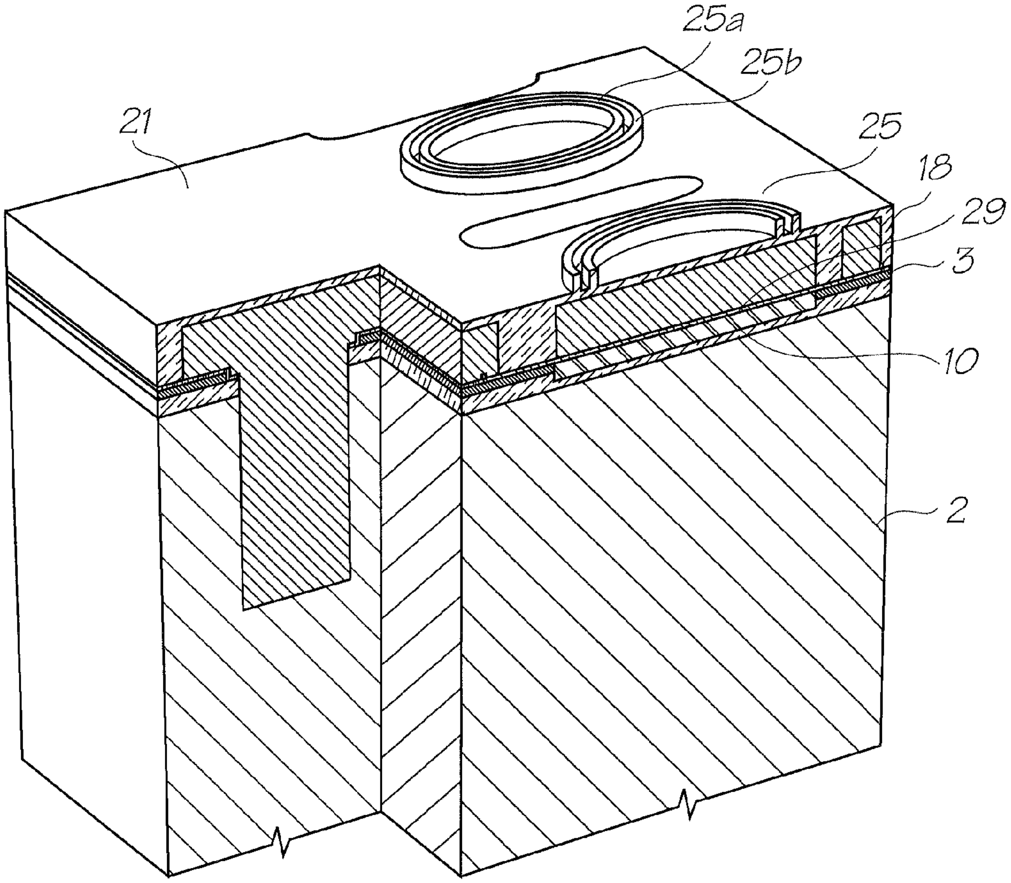
FIG. 8 is a perspective of the nozzle assembly shown in FIG. 7.

In the prior art process, and referring to FIGS. 6 to 8, the next stage of MEMS fabrication defines the elliptical nozzle rim 25 in the roof 21 by etching away 2 microns of roof material 20. This etch is defined using a layer of photoresist (not shown) exposed by the dark tone rim mask shown in FIG. 6. The elliptical rim 25 comprises two coaxial rim lips 25*a* and 25*b*, positioned over their respective thermal actuator 29.

Figure 9:
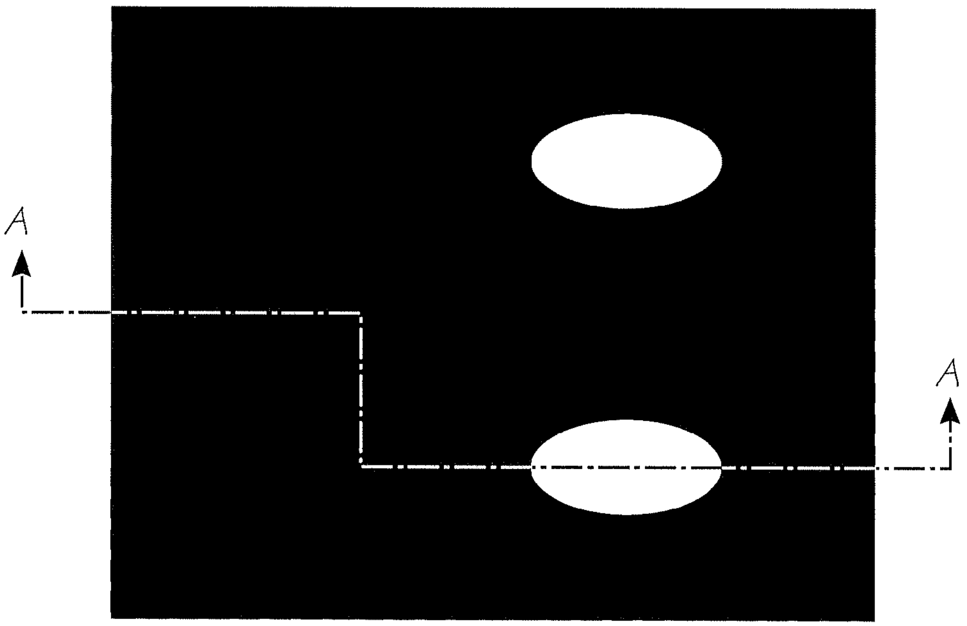
FIG. 9 is the mask associated with the nozzle opening etch shown in FIG. 10.
Figure 10:
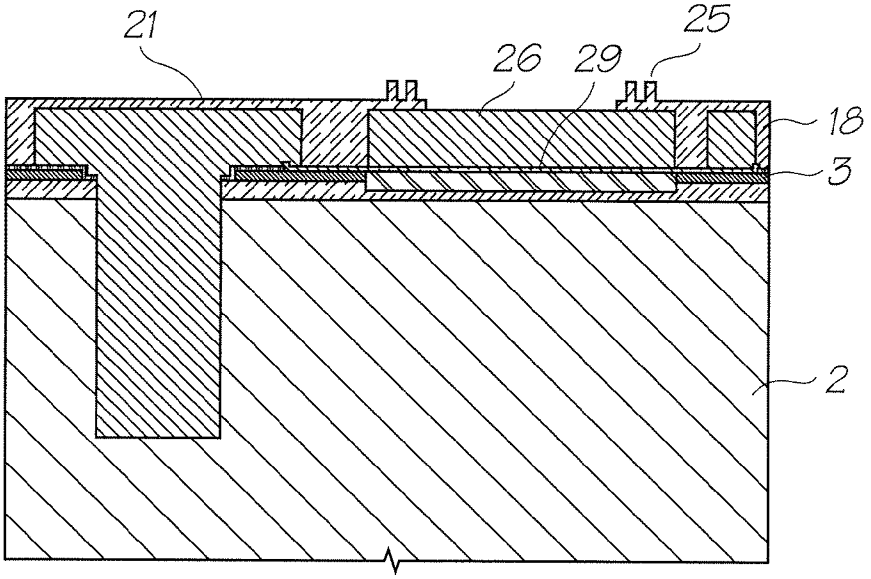
FIG. 10 shows the etch of the roof material to form the elliptical nozzle openings.
Figure 11:
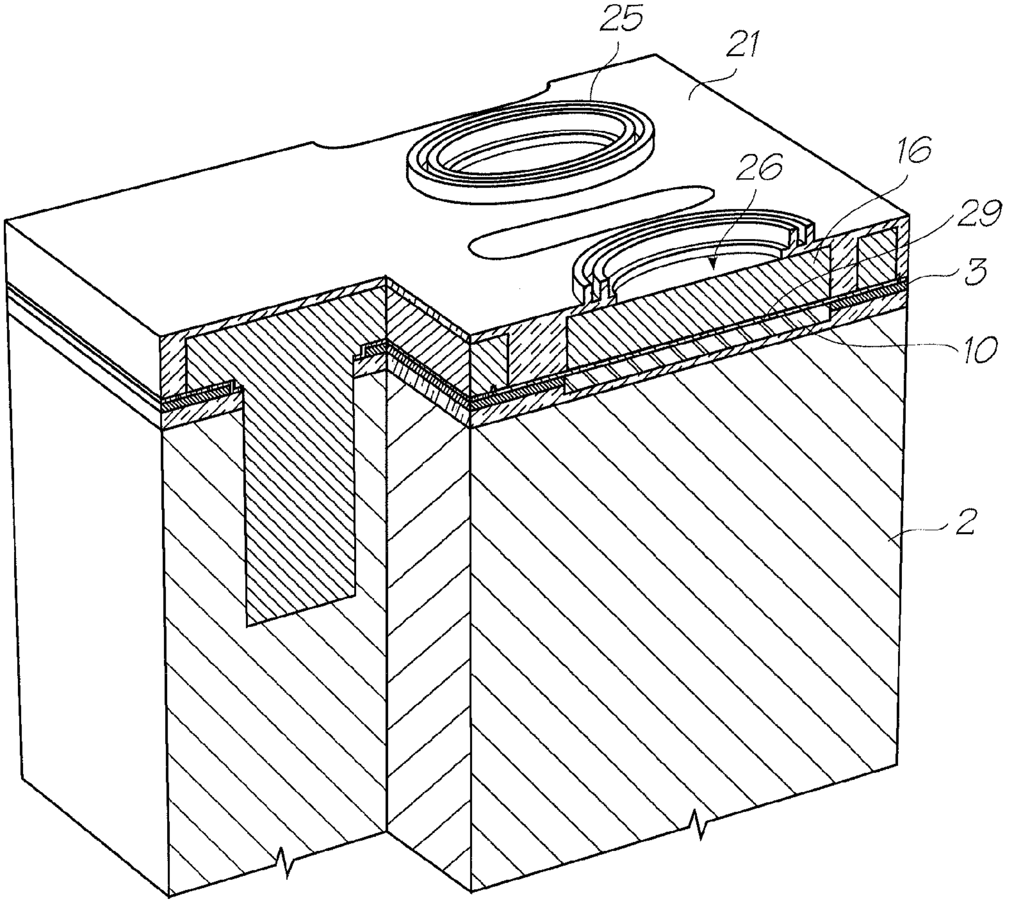
FIG. 11 is a perspective of the nozzle assembly shown in FIG. 10.

Referring to FIGS. 9 to 11, the next stage defines an elliptical nozzle aperture 26 in the roof 21 by etching all the way through the remaining roof material 20, which is bounded by the rim 25. This etch is defined using a layer of photoresist (not shown) exposed by the dark tone roof mask shown in FIG. 9. The elliptical nozzle aperture 26 is positioned over the thermal actuator 29, as shown in FIG. 11.

Figure 12:
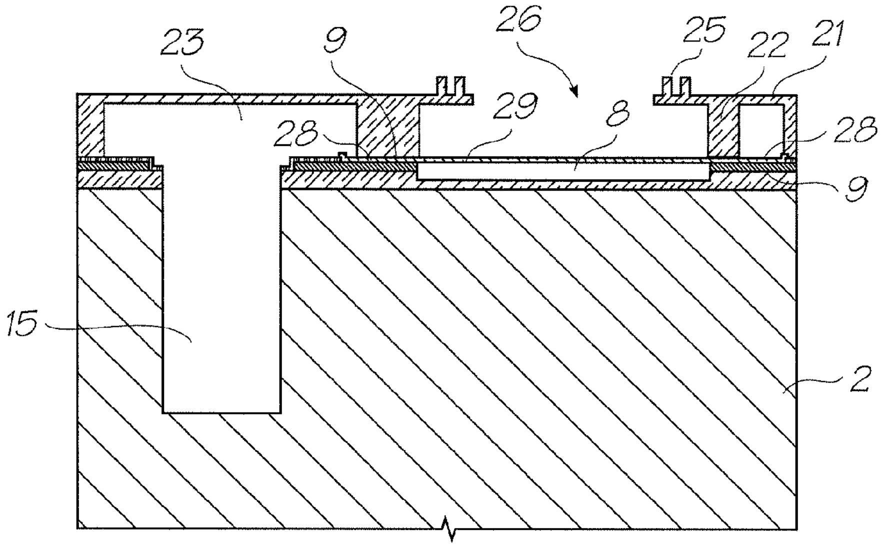
FIG. 12 shows the oxygen plasma ashing of the first and second sacrificial layers.
Figure 13:
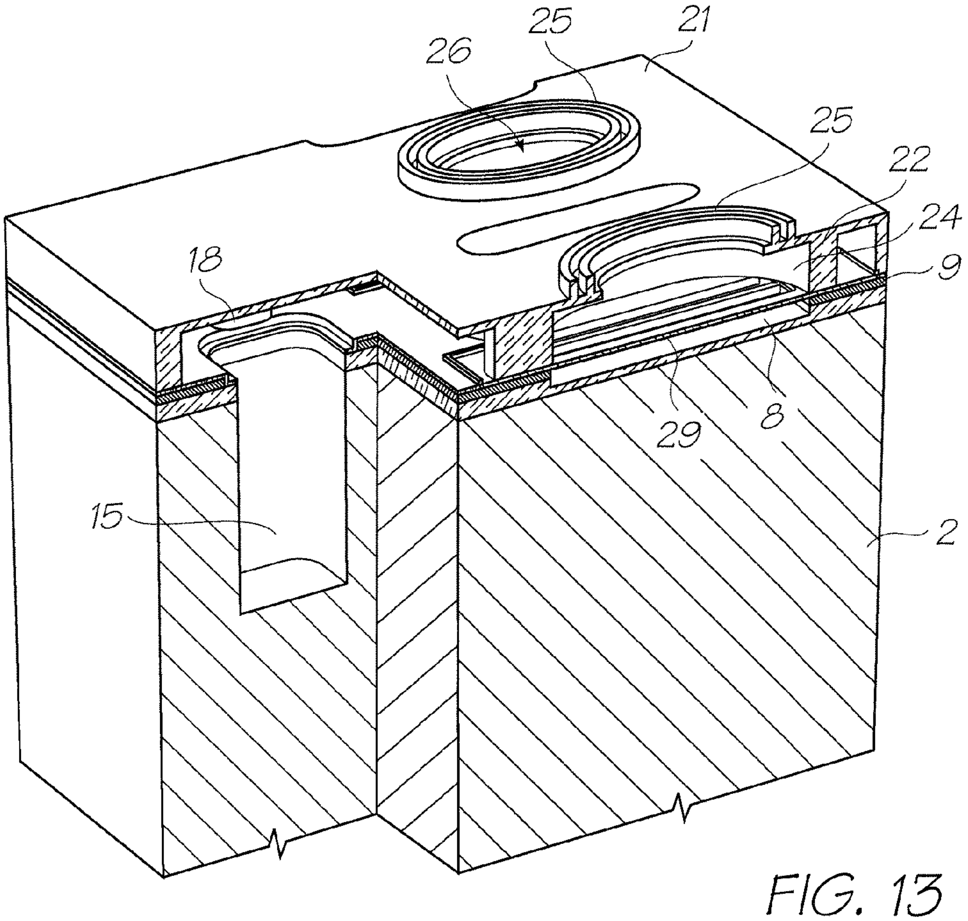
FIG. 13 is a perspective of the nozzle assembly shown in FIG. 12.
Figure 14:
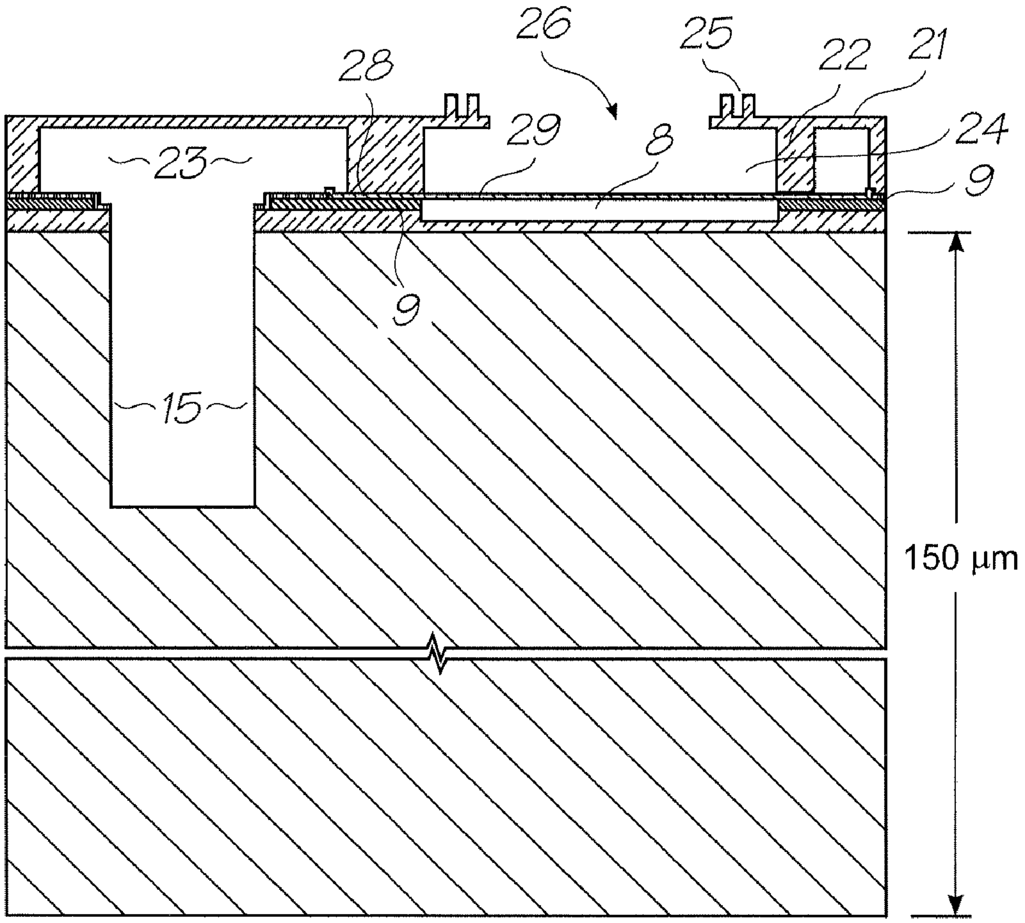
FIG. 14 shows the nozzle assembly after the ashing, as well as the opposing side of the wafer.
Figure 15:
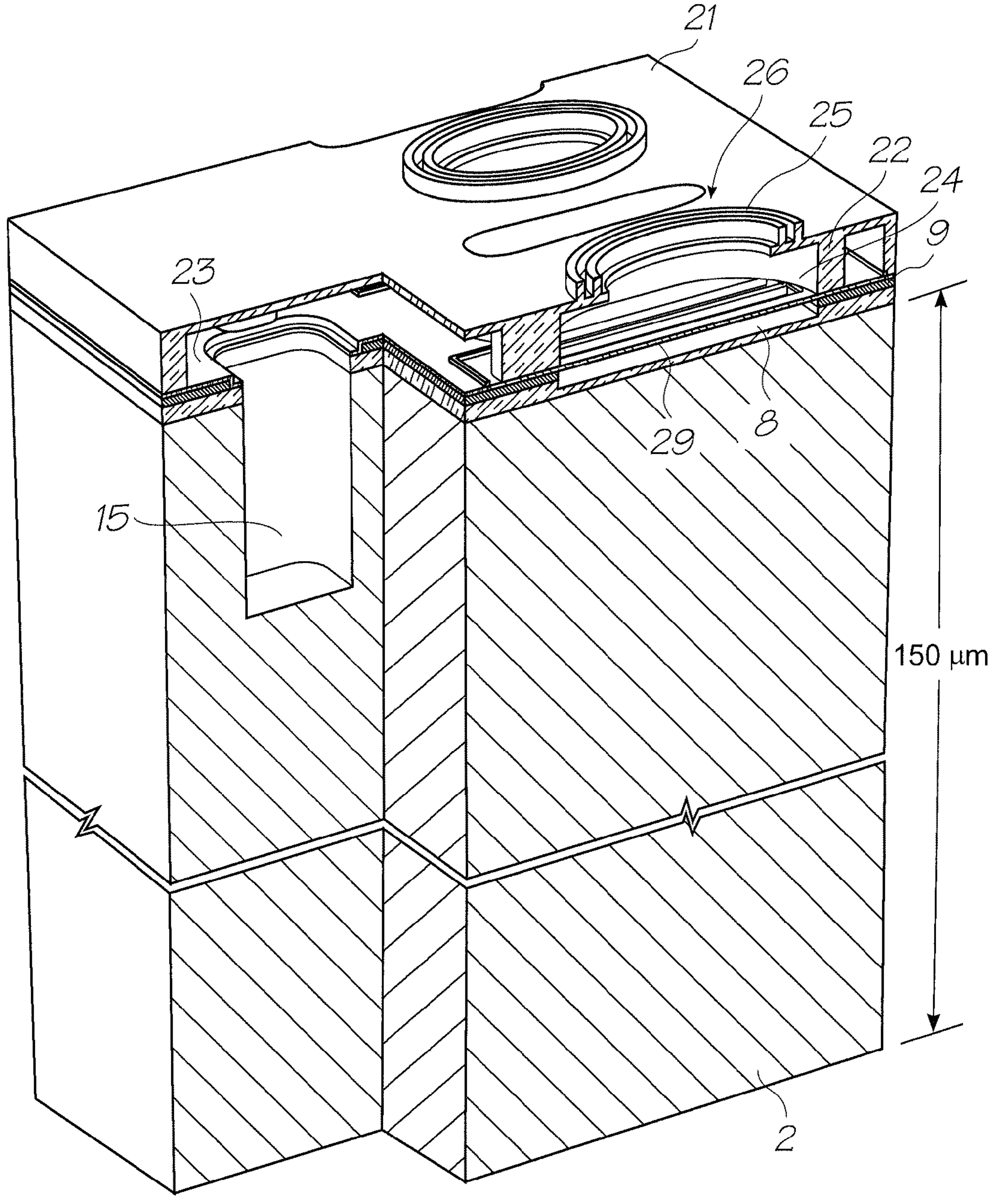
FIG. 15 is a perspective of the nozzle assembly shown in FIG. 14.

With all the MEMS nozzle features now fully formed, the next stage removes the SAC1 and SAC2 photoresist layers 10 and 16 by $O_2$ plasma ashing (FIGS. 12 and 13). FIGS. 14 and 15 show the entire thickness (150 microns) of the silicon wafer 2 after ashing the SAC1 and SAC2 photoresist layers 10 and 16.

Figure 16:
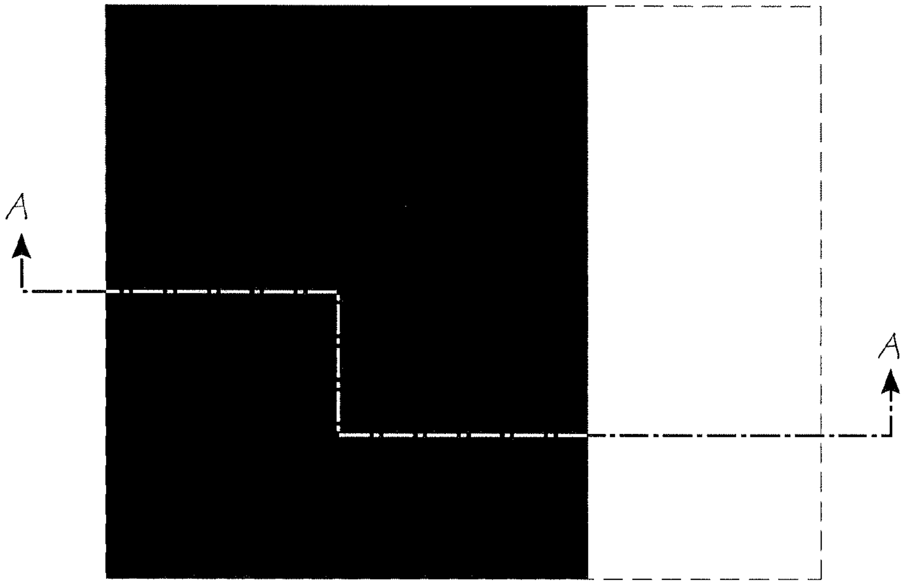
FIG. 16 is the mask associated with the backside etch shown in FIG. 17.
Figure 17:
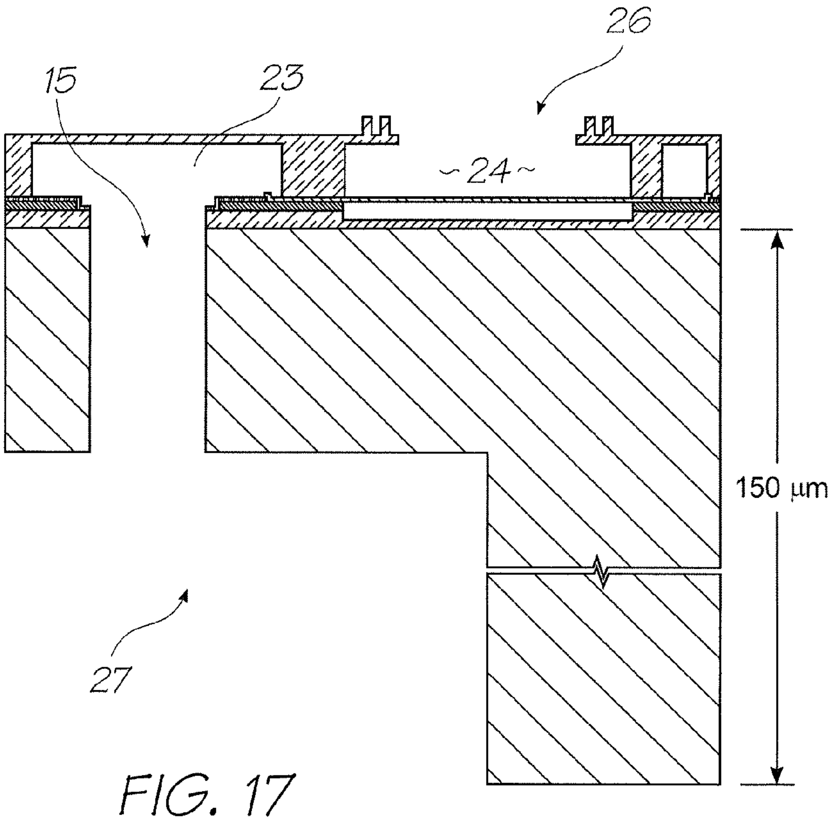
FIG. 17 shows the backside etch of the ink supply channel into the wafer.
Figure 18:
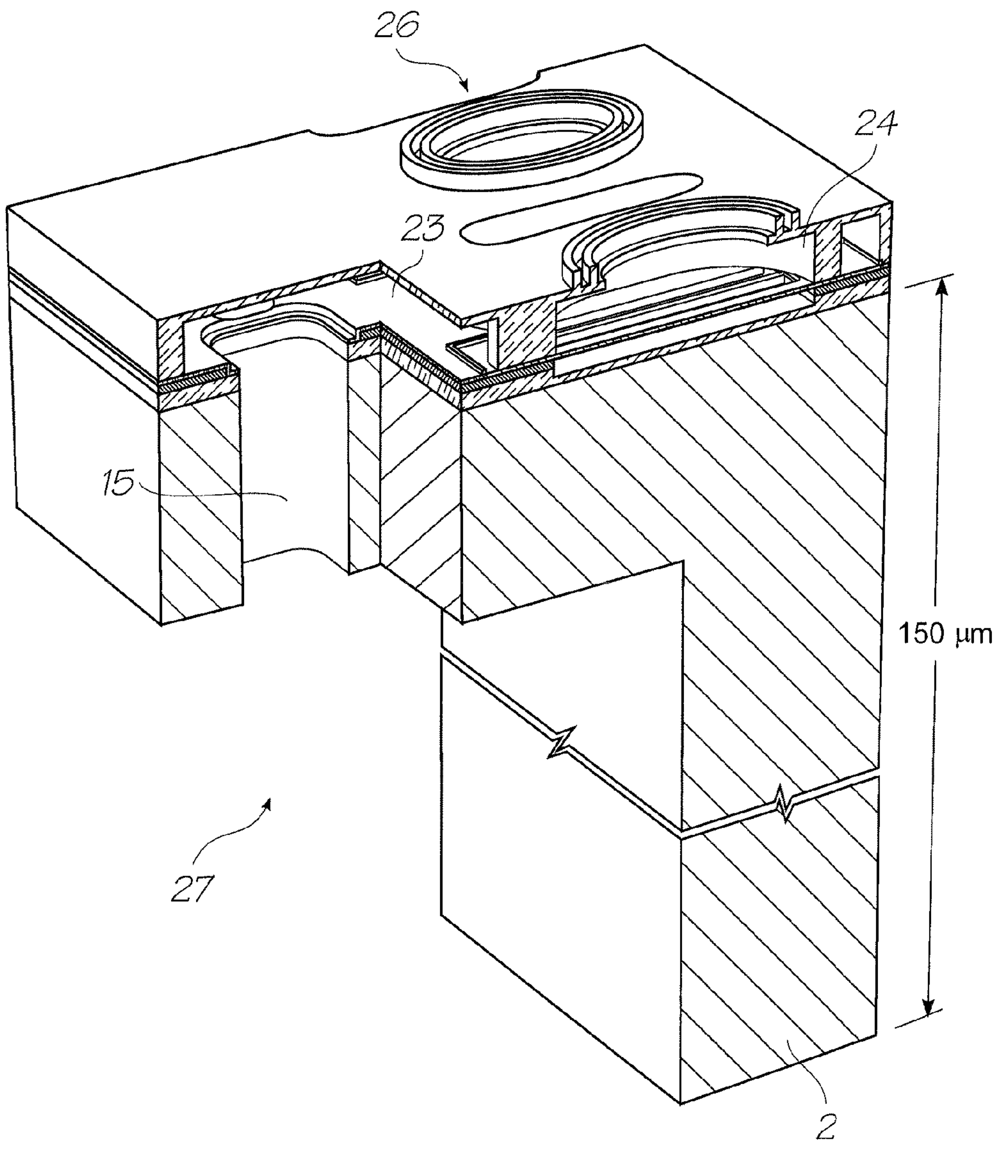
FIG. 18 is a perspective of the nozzle assembly shown in FIG. 17.

Referring to FIGS. 16 to 18, once frontside MEMS processing of the wafer is completed, ink supply channels 27 are etched from the backside of the wafer to meet with the ink inlets 15 using a standard anisotropic DRIE. This backside etch is defined using a layer of photoresist (not shown) exposed by the dark tone mask shown in FIG. 16. The ink supply channel 27 makes a fluidic connection between the backside of the wafer and the ink inlets 15.

Finally, and referring to FIGS. 2 and 3, the wafer is thinned to about 135 microns by backside etching. FIG. 1 shows three adjacent rows of nozzles in a cutaway perspective view of a completed printhead integrated circuit. Each row of nozzles has a respective ink supply channel 27 extending along its length and supplying ink to a plurality of ink inlets 15 in each row. The ink inlets, in turn, supply ink to the ink conduit 23 for each row, with each nozzle chamber receiving ink from a common ink conduit for that row.

As already discussed above, this prior art MEMS fabrication process inevitably leaves a hydrophilic ink ejection face by virtue of the nozzle plate 56 being formed of ceramic materials, such as silicon dioxide, silicon nitride, silicon oxynitride, aluminium nitride etc.

Nozzle Etch Followed by Hydrophobic Polymer Coating

As an alternative to the process described above, the nozzle plate 56 has a hydrophobic polymer deposited thereon immediately after the nozzle opening etch (i.e. at the stage represented in FIGS. 10 and 11). Since the photoresist scaffold layers must be subsequently removed, the polymeric material should be resistant to the ashing process. Preferably, the polymeric material should be resistant to removal by an $O_2$ or an $H_2$ ashing plasma. The Applicant has identified a family of polymeric materials which meet the above-mentioned requirements of being hydrophobic whilst at the same time being resistant to $O_2$ or $H_2$ ashing. These materials are typically polymerized siloxanes or fluorinated polyolefins. More specifically, polydimethylsiloxane (PDMS) and perfluorinated polyethylene (PFPE) have both been shown to be particularly advantageous. Such materials form a passivating surface oxide in an $O_2$ plasma, and subsequently recover their hydrophobicity relatively quickly. A further advantage of these materials is that they have excellent adhesion to ceramics, such as silicon dioxide and silicon nitride. A further advantage of these materials is that they are photopatternable, which makes them particularly suitable for use in a MEMS process. For example, PDMS is curable with UV light, whereby unexposed regions of PDMS can be removed relatively easily.

Figure 19:
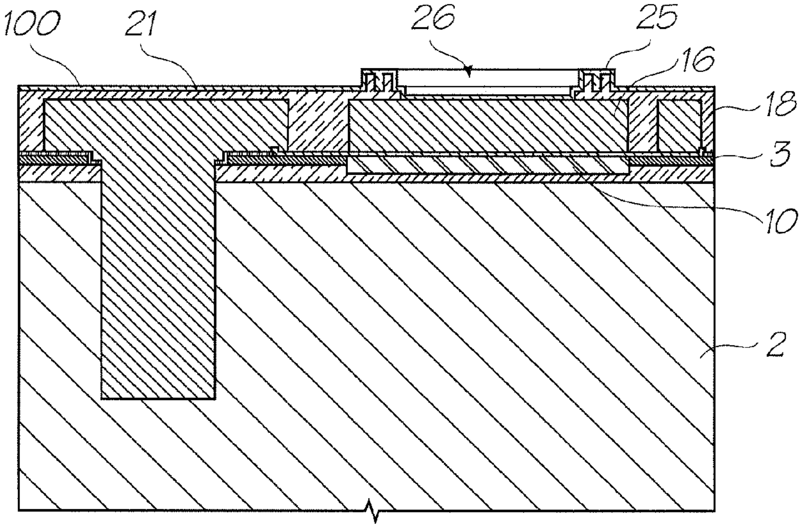
FIG. 19 shows the nozzle assembly of FIG. 10 after deposition of a hydrophobic polymeric coating.
Figure 20:
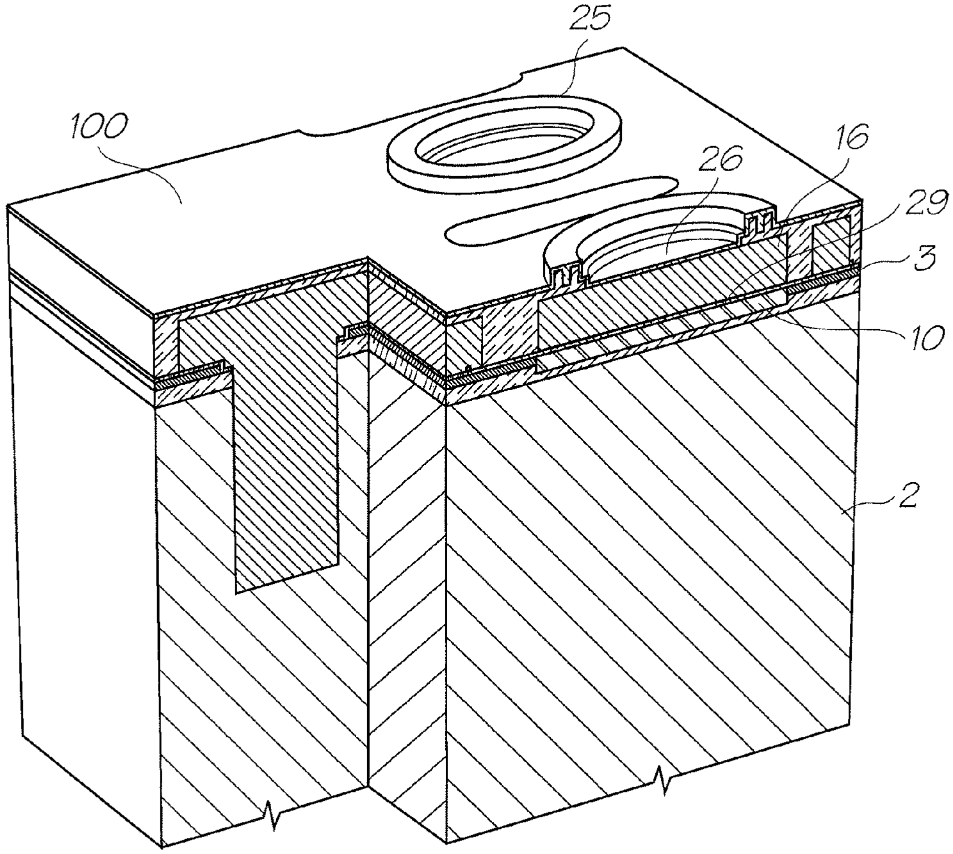
FIG. 20 is a perspective of the nozzle assembly shown in FIG. 19.

Referring to FIG. 10, there is shown a nozzle assembly of a partially-fabricated printhead after the rim and nozzle etches described earlier. However, instead of proceeding with SAC1 and SAC2 ashing (as shown in FIGS. 12 and 13), at this stage a thin layer (ca 1 micron) of hydrophobic polymeric material 100 is spun onto the nozzle plate 56, as shown in FIGS. 19 and 20.

Figure 21:
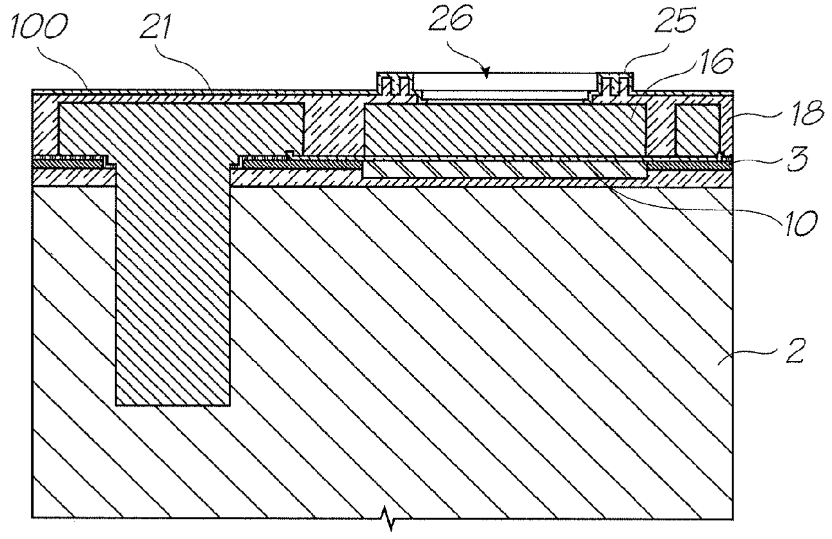
FIG. 21 shows the nozzle assembly of FIG. 19 after photopatterning of the polymeric coating.
Figure 22:
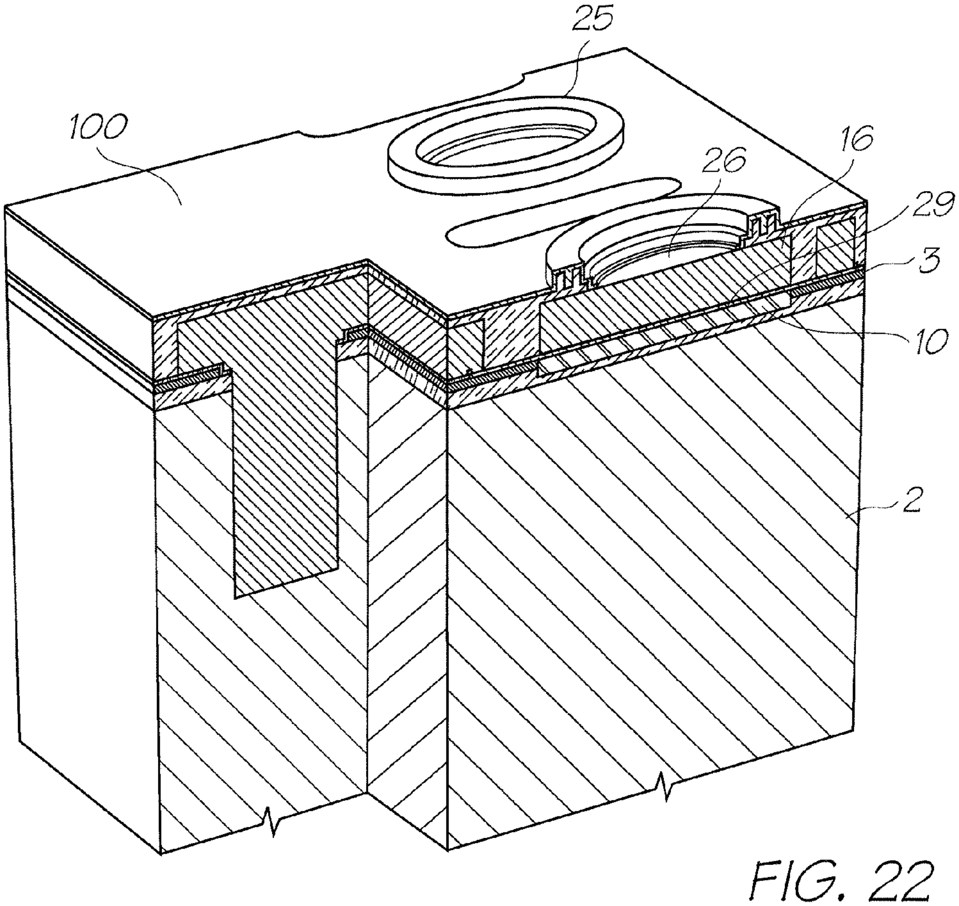
FIG. 22 is a perspective of the nozzle assembly shown in FIG. 21.

After deposition, this layer of polymeric material is photopatterned so as to remove the material deposited within the nozzle openings 26. Photopatterning may comprise exposure of the polymeric layer 100 to UV light, except for those regions within the nozzle openings 26. Accordingly, as shown in FIGS. 21 and 22, the printhead now has a hydrophobic nozzle plate, and subsequent MEMS processing steps can proceed analogously to the steps described in connection with FIGS. 12 to 18. Significantly, the hydrophobic polymer 100 is not removed by the $O_2$ ashing steps used to remove the photoresist scaffold 10 and 16.

Hydrophobic Polymer Coating Prior to Nozzle Etch with Poltmer Used as Etch Mask

As an alternative process, the hydrophobic polymer layer 100 is deposited immediately after the stage represented by FIGS. 7 and 8. Accordingly, the hydrophobic polymer is spun onto the nozzle plate after the rim 25 is defined by the rim etch, but before the nozzle opening 26 is defined by the nozzle etch.

Figure 23:
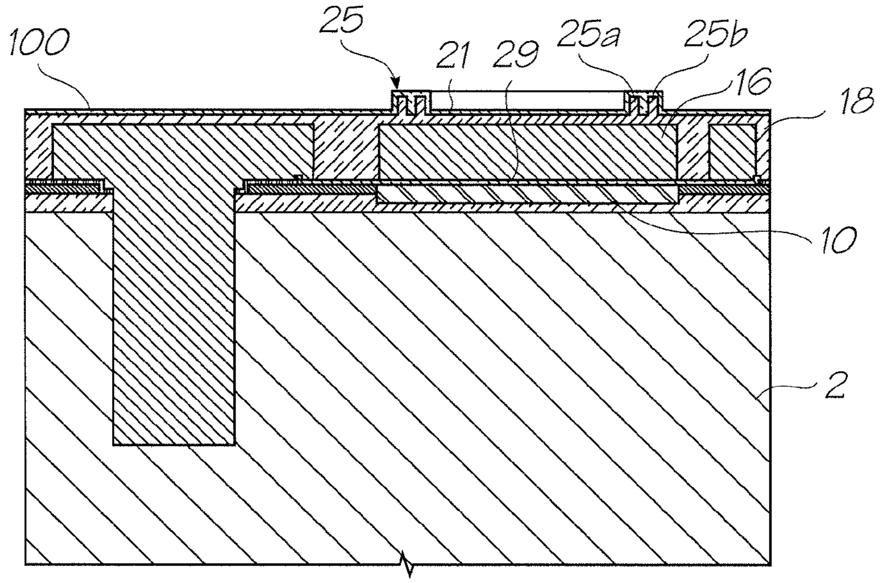
FIG. 23 shows the nozzle assembly of FIG. 7 after deposition of a hydrophobic polymeric coating.
Figure 24:
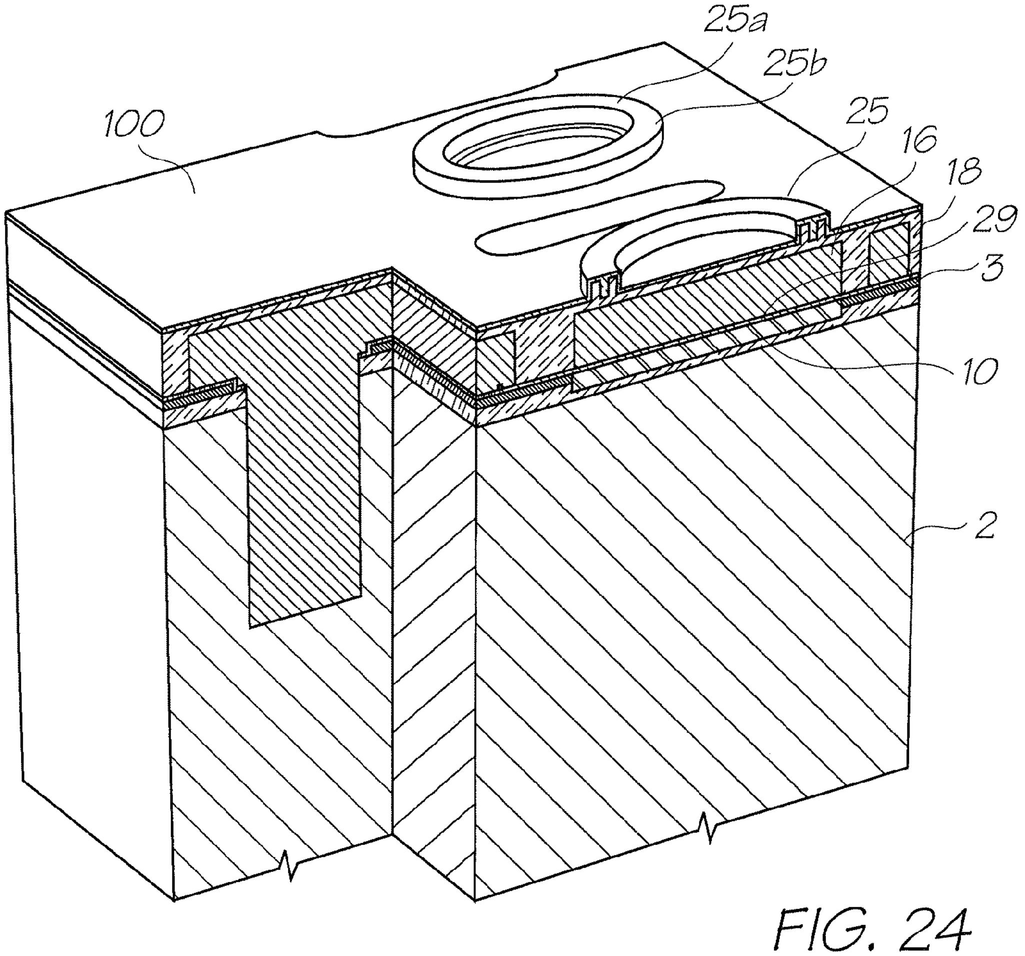
FIG. 24 is a perspective of the nozzle assembly shown in FIG. 23.
Figure 25:
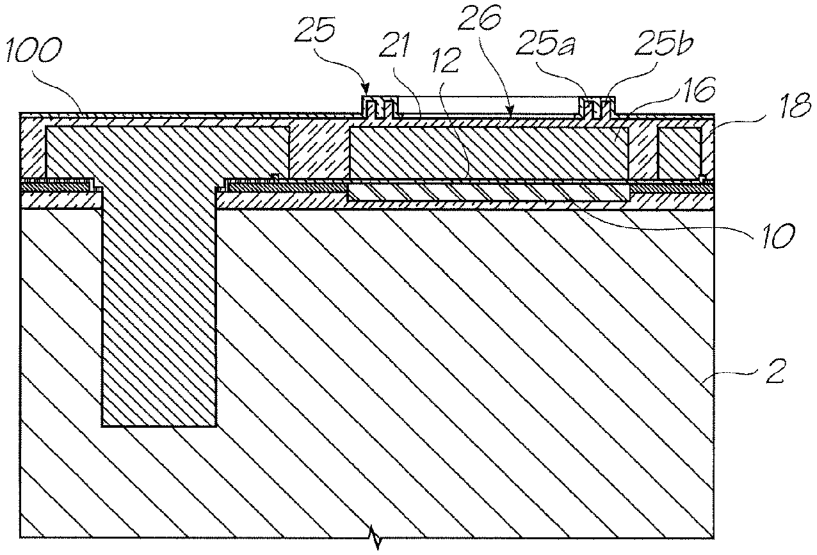
FIG. 25 shows the nozzle assembly of FIG. 23 after photopatterning of the polymeric coating.
Figure 26:
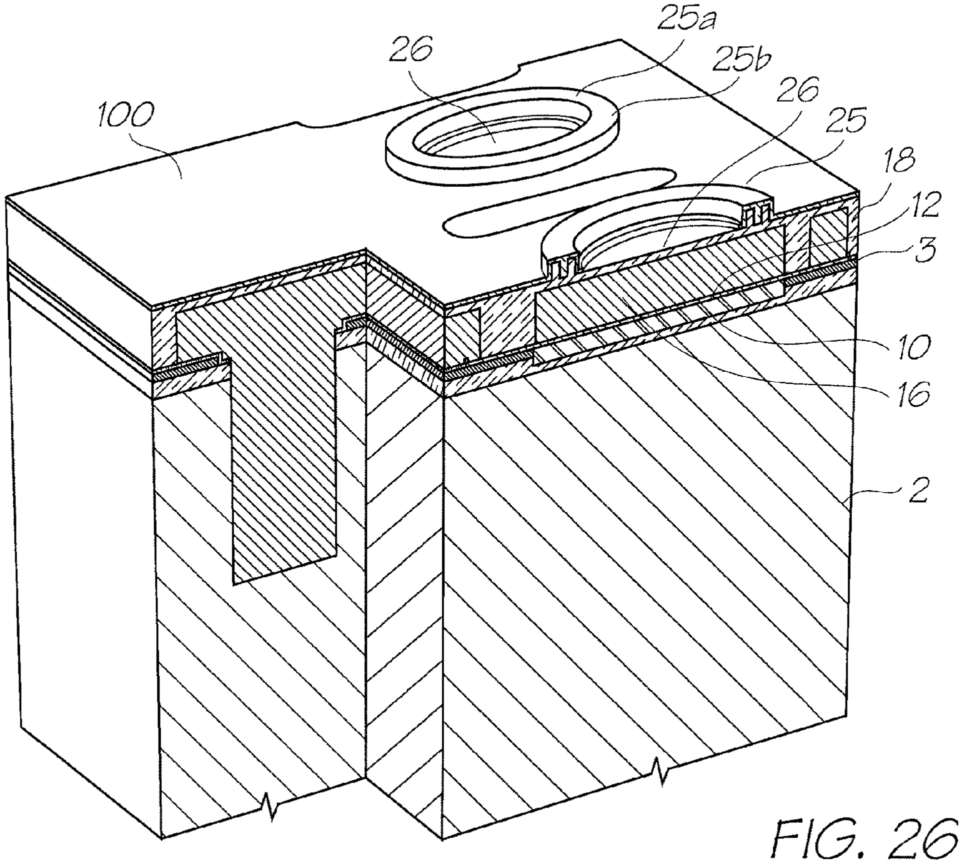
FIG. 26 is a perspective of the nozzle assembly shown in FIG. 25.

Referring to FIGS. 23 and 24, there is shown a nozzle assembly after deposition of the hydrophobic polymer 100. The polymer 100 is then photopatterned so as to remove the material bounded by the rim 25 in the nozzle opening region, as shown in FIGS. 25 and 26. Hence, the hydrophobic polymeric material 100 can now act as an etch mask for etching the nozzle opening 26.

The nozzle opening 26 is defined by etching through the roof structure 21, which is typically performed using a gas chemistry comprising $O_2$ and a fluorinated hydrocarbon (e.g. $CF_4$ or $C_4F_8$). Hydrophobic polymers, such as PDMS and PFPE, are normally etched under the same conditions. However, since materials such as silicon nitride etch much more rapidly, the roof 21 can be etched selectively using either PDMS or PFPE as an etch mask. By way of comparison, with a gas ratio of 3:1 ($CF_4$:$O_2$), silicon nitride etches at about 240 microns per hour, whereas PDMS etches at about 20 microns per hour. Hence, it will be appreciated that etch selectivity using a PDMS mask is achievable when defining the nozzle opening 26.

Once the roof 21 is etched to define the nozzle opening, the nozzle assembly 24 is as shown in FIGS. 21 and 22. Accordingly, subsequent MEMS processing steps can proceed analogously to the steps described in connection with FIGS. 12 to 18. Significantly, the hydrophobic polymer 100 is not removed by the $O_2$ ashing steps used to remove the photoresist scaffold 10 and 16.

Hydrophobic Polymer Coating Prior to Nozzle Etch with Additional Photoresist Mask FIGS. 25 and 26 illustrate how the hydrophobic polymer 100 may be used as an etch mask for a nozzle opening etch. Typically, different etch rates between the polymer 100 and the roof 21, as discussed above, provides sufficient etch selectivity.

However, as a further alternative and particularly to accommodate situations where there is insufficient etch selectivity, a layer of photoresist (not shown) may be deposited over the hydrophobic polymer 100 shown in FIG. 24, which enables conventional downstream MEMS processing. Having photopatterned this top layer of resist, the hydrophobic polymer 100 and the roof 21 may be etched in one step using the same gas chemistry, with the top layer of a photoresist being used as a standard etch mask. A gas chemistry of, for example, $CF_4$/$O_2$ first etches through the hydrophobic polymer 100 and then through the roof 21.

Subsequent $O_2$ ashing may be used to remove just the top layer of photoresist (to obtain the nozzle assembly shown in FIGS. 10 and 11), or prolonged $O_2$ ashing may be used to remove both the top layer of photoresist and the sacrificial photoresist layers 10 and 16 (to obtain the nozzle assembly shown in FIGS. 12 and 13).

The skilled person will be able to envisage other alternative sequences of MEMS processing steps, in addition to the three alternatives discussed herein. However, it will be appreciated that in identifying hydrophobic polymers capable of withstanding $O_2$ and $H_2$ ashing, the present inventors have provided a viable means for providing a hydrophobic nozzle plate in an inkjet printhead fabrication process.

Thermal Bend Actuator Printhead

Having discussed ways in which a nozzle plate of a printhead may be hydrophobized, it will be appreciated that any type of printhead may be hydrophobized in an analogous manner. However, the present invention realizes particular advantages in connection with the Applicant's previously described printhead comprising thermal bend actuator nozzle assemblies. Accordingly, a discussion of how the present invention may be used in such printheads now follows.

In a thermal bend actuated printhead, a nozzle assembly may comprise a nozzle chamber having a roof portion which moves relative to a floor portion of the chamber. The moveable roof portion is typically actuated to move towards the floor portion by means of a bi-layered thermal bend actuator. Such an actuator may be positioned externally of the nozzle chamber or it may define the moving part of the roof structure.

A moving roof is advantageous, because it lowers the drop ejection energy by only having one face of the moving structure doing work against the viscous ink. However, a problem with such moving roof structures is that it is necessary to seal the ink inside the nozzle chamber during actuation. Typically, the nozzle chamber relies on a fluidic seal, which forms a seal using the surface tension of the ink. However, such seals are imperfect and it would be desirable to form a mechanical seal which avoids relying on surface tension as a means for containing the ink. Such a mechanical seal would need to be sufficiently flexible to accommodate the bending motion of the roof.

A typical nozzle assembly 400 having a moving roof structure was described in our previously filed U.S. application Ser. No. 11/607,976 filed on Dec. 4, 2006 (the contents of which is herein incorporated by reference) and is shown here in FIGS. 27 to 30. The nozzle assembly 400 comprises a nozzle chamber 401 formed on a passivated CMOS layer 402 of a silicon substrate 403. The nozzle chamber is defined by a roof 404 and sidewalls 405 extending from the roof to the passivated CMOS layer 402. Ink is supplied to the nozzle chamber 401 by means of an ink inlet 406 in fluid communication with an ink supply channel 407 receiving ink from a backside of the silicon substrate. Ink is ejected from the nozzle chamber 401 by means of a nozzle opening 408 defined in the roof 404. The nozzle opening 408 is offset from the ink inlet 406.

Figure 27:
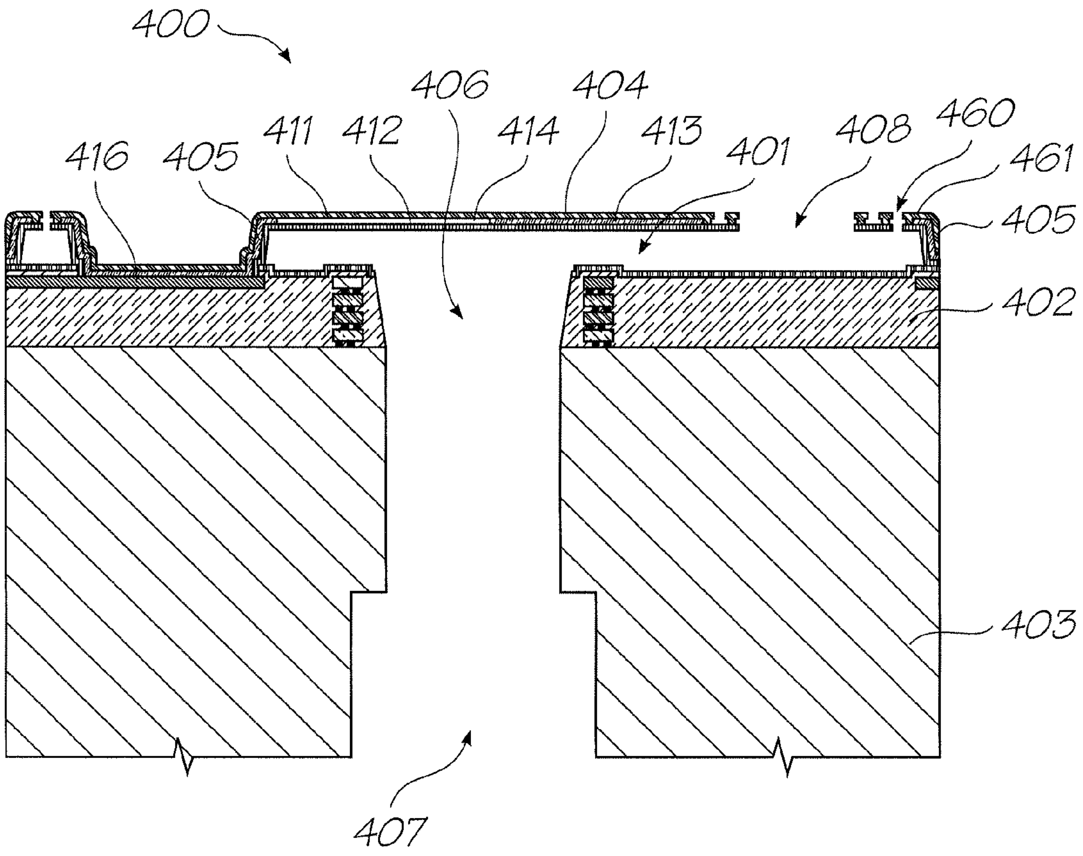
FIG. 27 is a side sectional view of an inkjet nozzle assembly comprising a roof having a moving portion defined by a thermal bend actuator.
Figure 28:
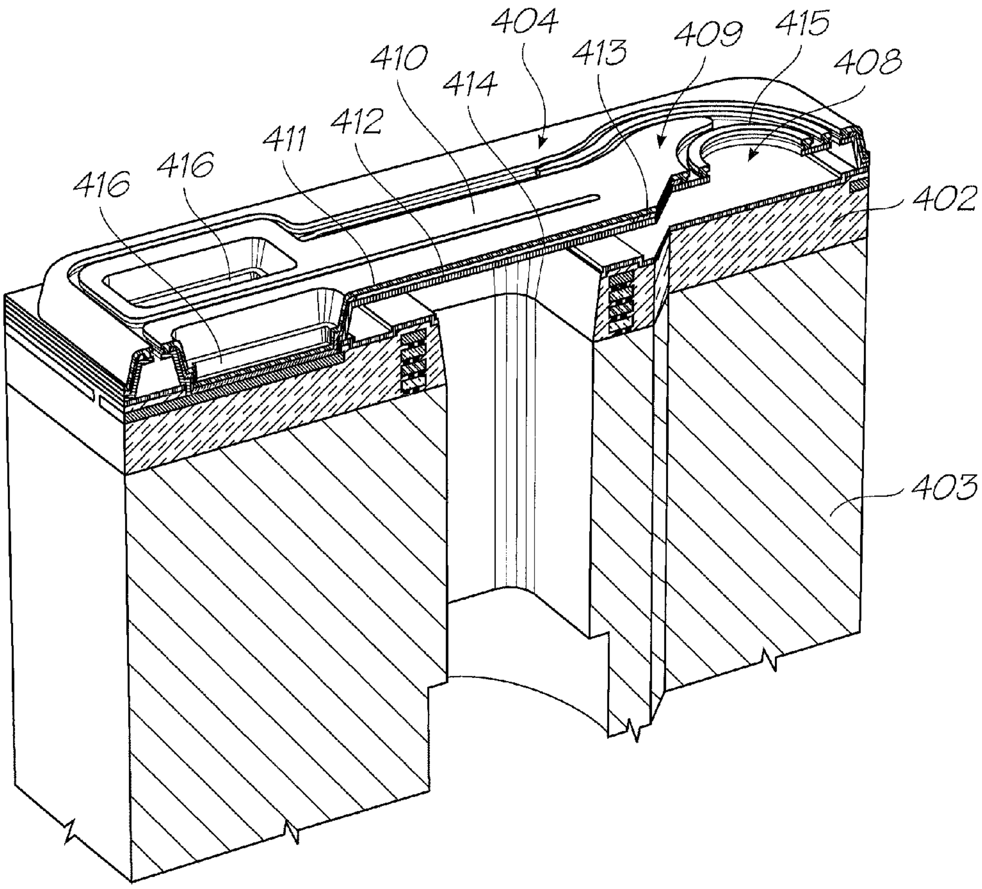
FIG. 28 is a cutaway perspective view of the nozzle assembly shown in FIG. 27.
Figure 29:
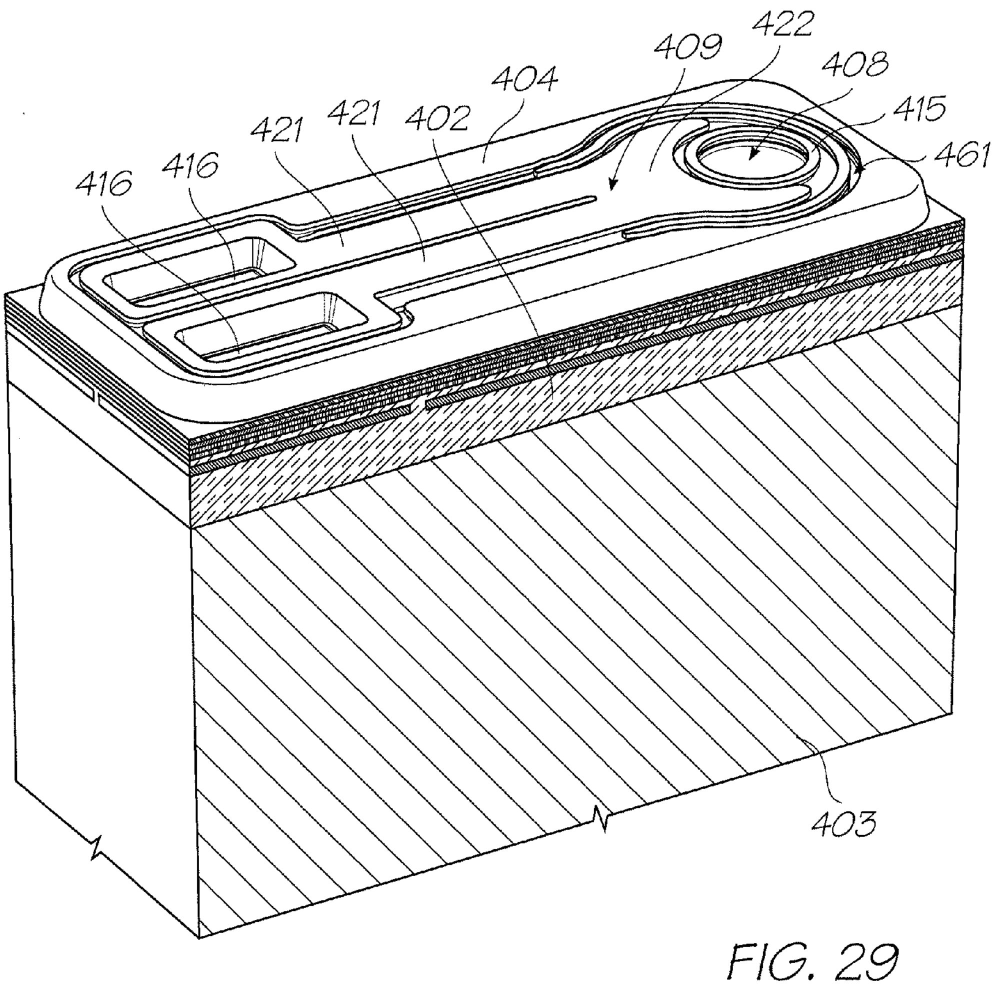
FIG. 29 is a perspective view of the nozzle assembly shown in FIG. 27.
Figure 30:
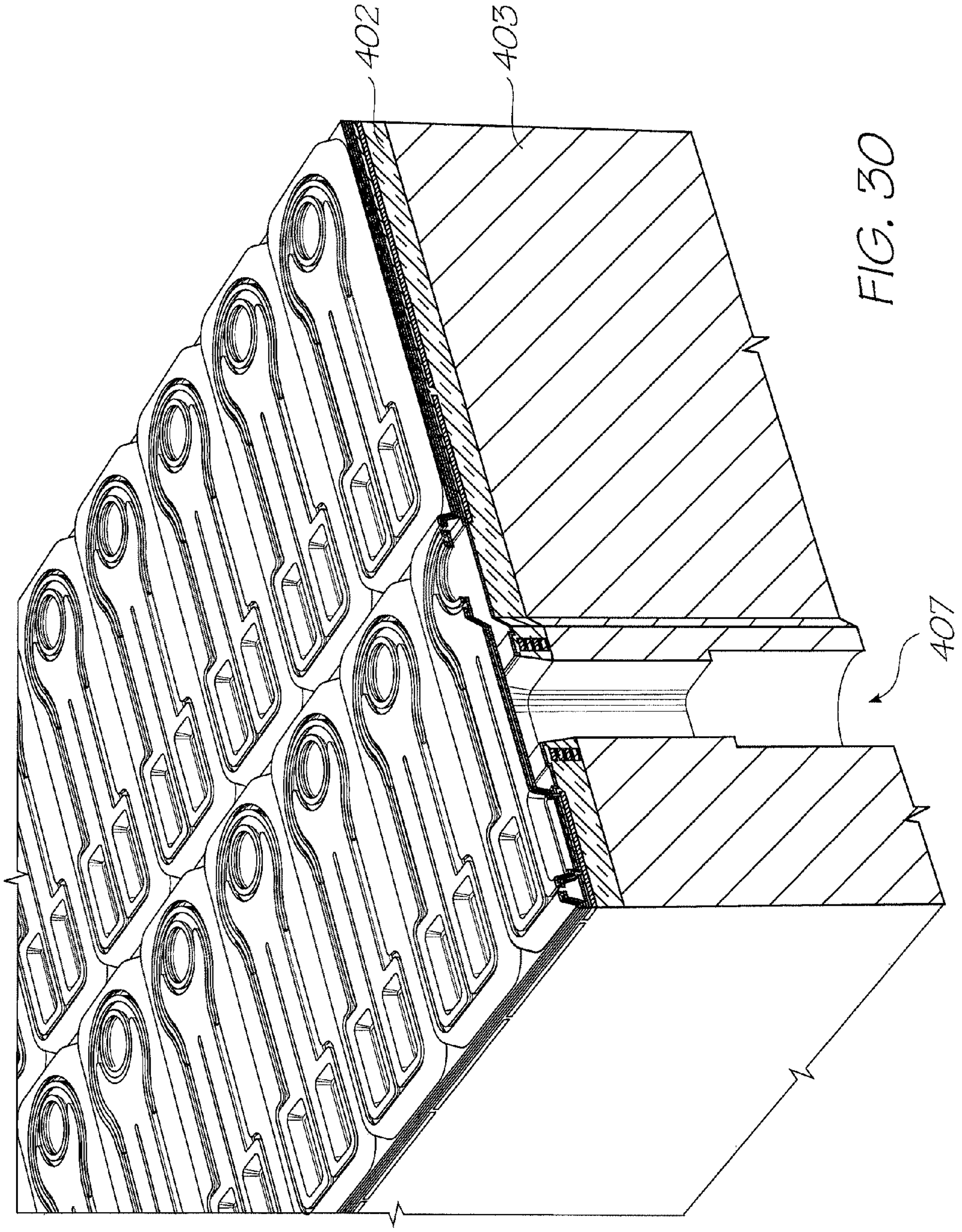
FIG. 30 is a cutaway perspective view of an array of the nozzle assemblies shown in FIG. 27.

As shown more clearly in FIG. 28, the roof 404 has a moving portion 409, which defines a substantial part of the total area of the roof. Typically, the moving portion 409 defines at least 50% of the total area of the roof 404. In the embodiment shown in FIGS. 27 to 30, the nozzle opening 408 and nozzle rim 415 are defined in the moving portion 409, such that the nozzle opening and nozzle rim move with the moving portion.

The nozzle assembly 400 is characterized in that the moving portion 409 is defined by a thermal bend actuator 410 having a planar upper active beam 411 and a planar lower passive beam 412. Hence, the actuator 410 typically defines at least 50% of the total area of the roof 404. Correspondingly, the upper active beam 411 typically defines at least 50% of the total area of the roof 404.

As shown in FIGS. 27 and 28, at least part of the upper active beam 411 is spaced apart from the lower passive beam 412 for maximizing thermal insulation of the two beams. More specifically, a layer of Ti is used as a bridging layer 413 between the upper active beam 411 comprised of TiN and the lower passive beam 412 comprised of $SiO_2$. The bridging layer 413 allows a gap 414 to be defined in the actuator 410 between the active and passive beams. This gap 414 improves the overall efficiency of the actuator 410 by minimizing thermal transfer from the active beam 411 to the passive beam 412.

However, it will of course be appreciated that the active beam 411 may, alternatively, be fused or bonded directly to the passive beam 412 for improved structural rigidity. Such design modifications would be well within the ambit of the skilled person.

The active beam 411 is connected to a pair of contacts 416 (positive and ground) via the Ti bridging layer. The contacts 416 connect with drive circuitry in the CMOS layers.

When it is required to eject a droplet of ink from the nozzle chamber 401, a current flows through the active beam 411 between the two contacts 416. The active beam 411 is rapidly heated by the current and expands relative to the passive beam 412, thereby causing the actuator 410 (which defines the moving portion 409 of the roof 404) to bend downwards towards the substrate 403. Since the gap 460 between the moving portion 409 and a static portion 461 is so small, surface tension can generally be relied up to seal this gap when the moving portion is actuated to move towards the substrate 403.

The movement of the actuator 410 causes ejection of ink from the nozzle opening 408 by a rapid increase of pressure inside the nozzle chamber 401. When current stops flowing, the moving portion 409 of the roof 404 is allowed to return to its quiescent position, which sucks ink from the inlet 406 into the nozzle chamber 401, in readiness for the next ejection.

Turning to FIG. 12, it will be readily appreciated that the nozzle assembly may be replicated into an array of nozzle assemblies to define a printhead or printhead integrated circuit. A printhead integrated circuit comprises a silicon substrate, an array of nozzle assemblies (typically arranged in rows) formed on the substrate, and drive circuitry for the nozzle assemblies. A plurality of printhead integrated circuits may be abutted or linked to form a pagewidth inkjet printhead, as described in, for example, Applicant's earlier U.S. application Ser. No. 10/854,491 filed on May 27, 2004 and Ser. No. 11/014,732 filed on Dec. 20, 2004, the contents of which are herein incorporated by reference.

Figure 32:
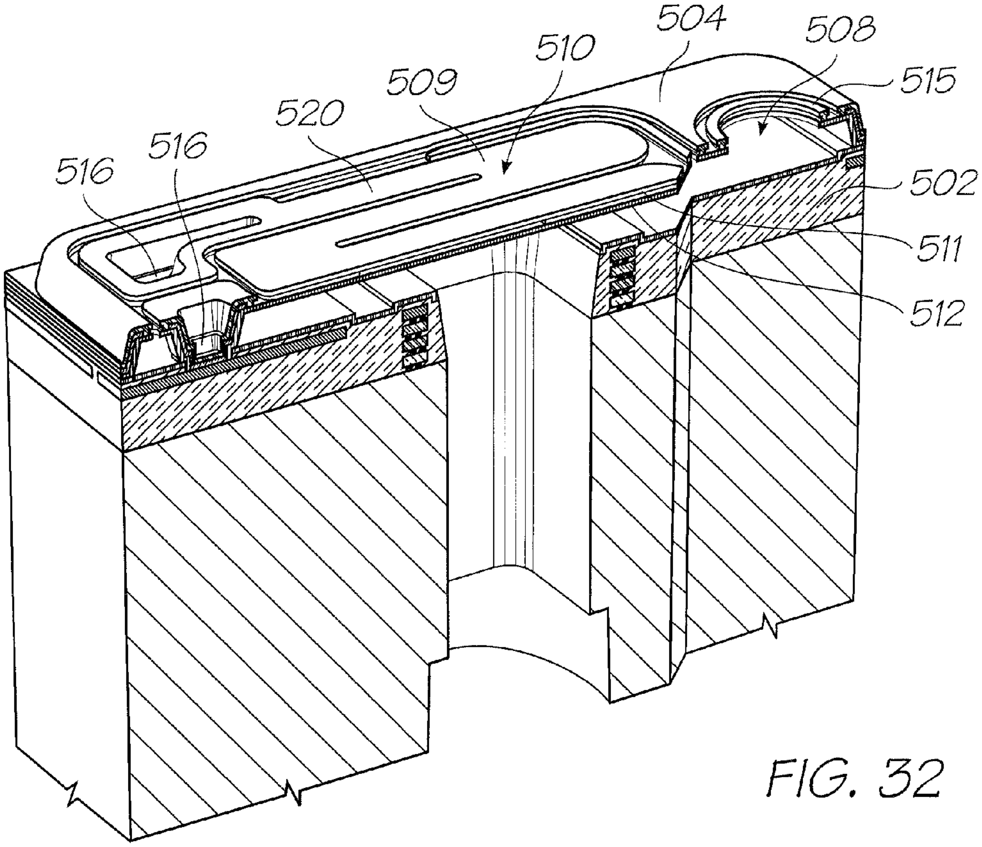
FIG. 32 is a cutaway perspective view of the nozzle assembly shown in FIG. 31.
Figure 31:
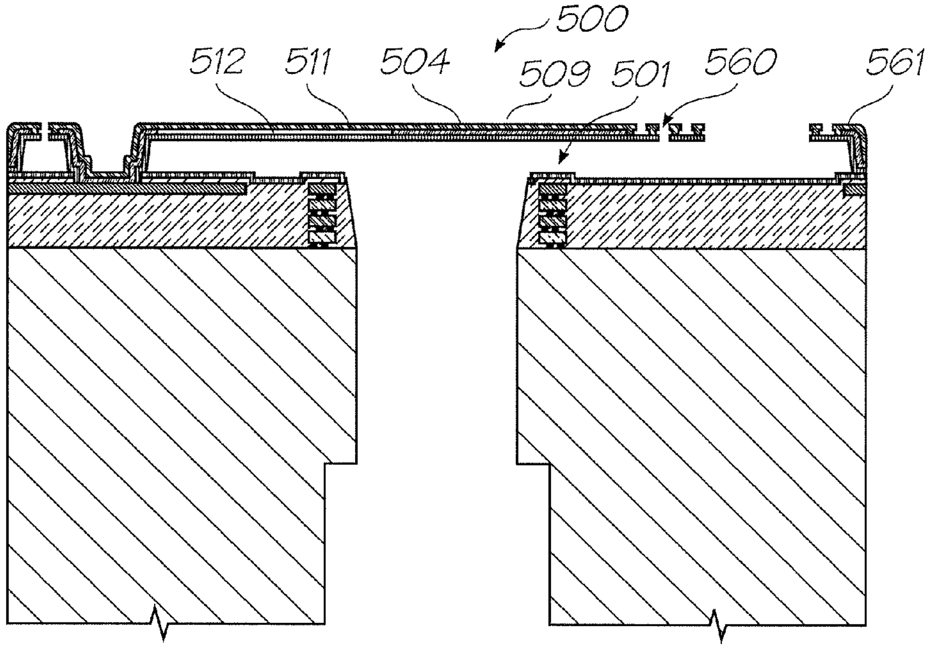
FIG. 31 is a side sectional view of an alternative inkjet nozzle assembly comprising a roof having a moving portion defined by a thermal bend actuator.
Figure 33:
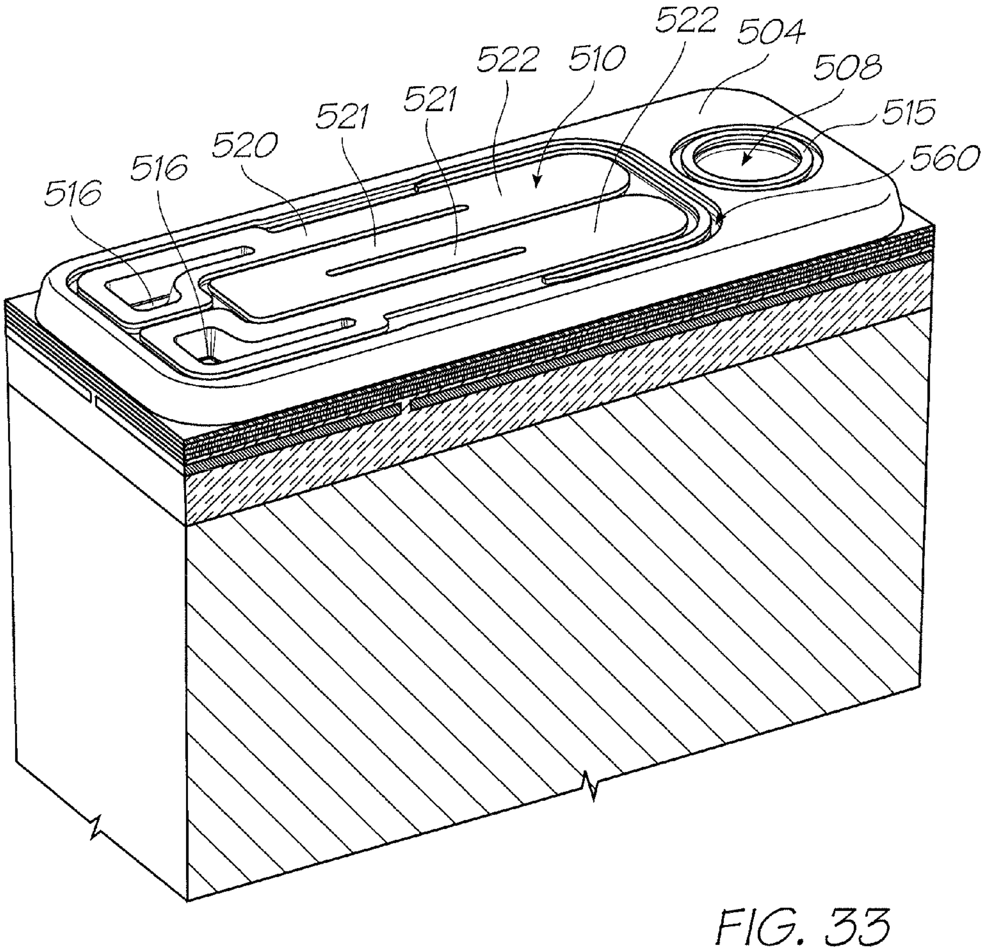
FIG. 33 is a perspective view of the nozzle assembly shown in FIG. 31.

An alternative nozzle assembly 500 shown in FIGS. 31 to 33 is similar to the nozzle assembly 400 insofar as a thermal bend actuator 510, having an upper active beam 511 and a lower passive beam 512, defines a moving portion of a roof 504 of the nozzle chamber 501.

However, in contrast with the nozzle assembly 400, the nozzle opening 508 and rim 515 are not defined by the moving portion of the roof 504. Rather, the nozzle opening 508 and rim 515 are defined in a fixed or static portion 561 of the roof 504 such that the actuator 510 moves independently of the nozzle opening and rim during droplet ejection. An advantage of this arrangement is that it provides more facile control of drop flight direction. Again, the small dimensions of the gap 460, between the moving portion 509 and the static portion 561, is relied up to create a fluidic seal during actuation by using the surface tension of the ink.

The nozzle assemblies 400 and 500, and corresponding printheads, may be constructed using suitable MEMS processes in an analogous manner to those described above. In all cases the roof of the nozzle chamber (moving or otherwise) is formed by deposition of a roof material onto a suitable sacrificial photoresist scaffold.

Figure 34:
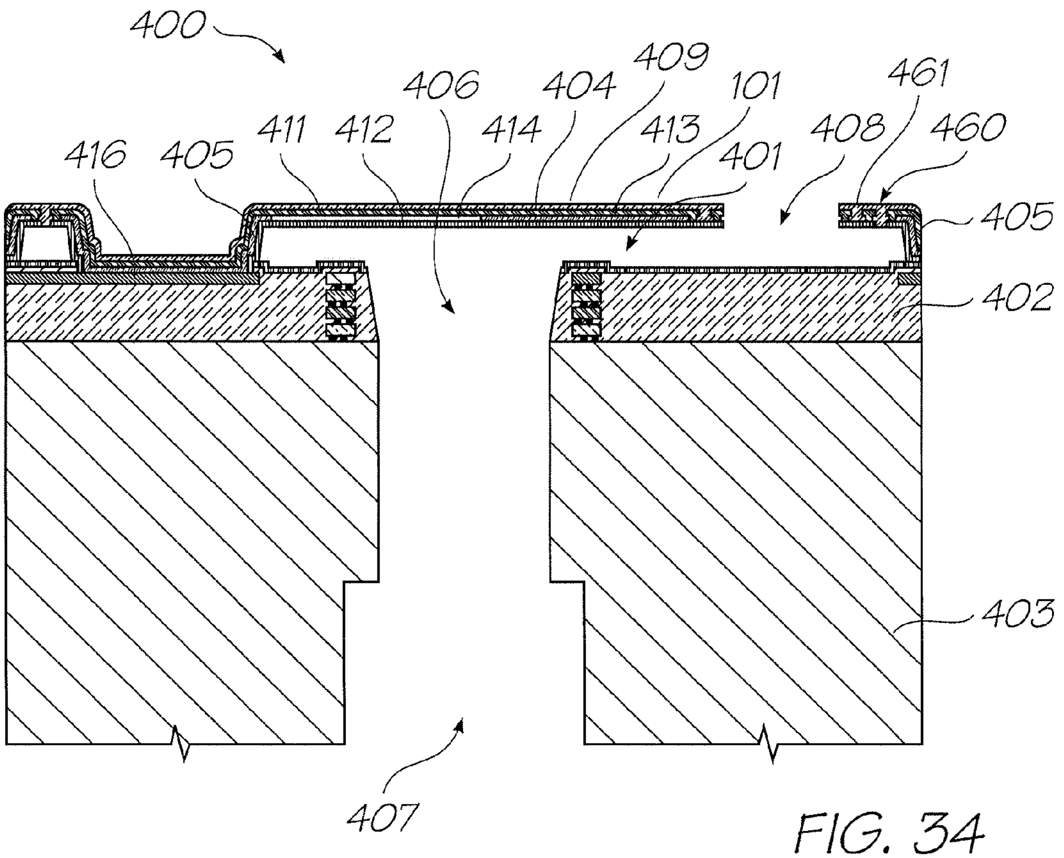
FIG. 34 shows the nozzle assembly of FIG. 27 with a polymeric coating on the roof forming a mechanical seal between a moving roof portion and a static roof portion.

Referring now to FIG. 34, it will be seen that the nozzle assembly 400 previously shown in FIG. 27 now has an additional layer of hydrophobic polymer 101 (as described in detail above) coated on the roof, including both the moving 409 and static portions 461 of the roof. Importantly, the hydrophobic polymer 101 seals the gap 460 shown in FIG. 27. It is an advantage of polymers such as PDMS and PFPE that they have extremely low stiffness. Typically, these materials have a Young's modulus of less than 1000 MPa and typically of the order of about 500 MPa. This characteristic is advantageous, because it enables them to form a mechanical seal in thermal bend actuator nozzles of the type described herein—the polymer stretches elastically during actuation, without significantly impeding the movement of the actuator. Indeed, an elastic seal assists in the bend actuator returning to its quiescent position, which is when drop ejection occurs. Moreover, with no gap between a moving roof portion 409 and a static roof portion 461, ink is fully sealed inside the nozzle chamber 401 and cannot escape, other than via the nozzle opening 508, during actuation.

Figure 35:
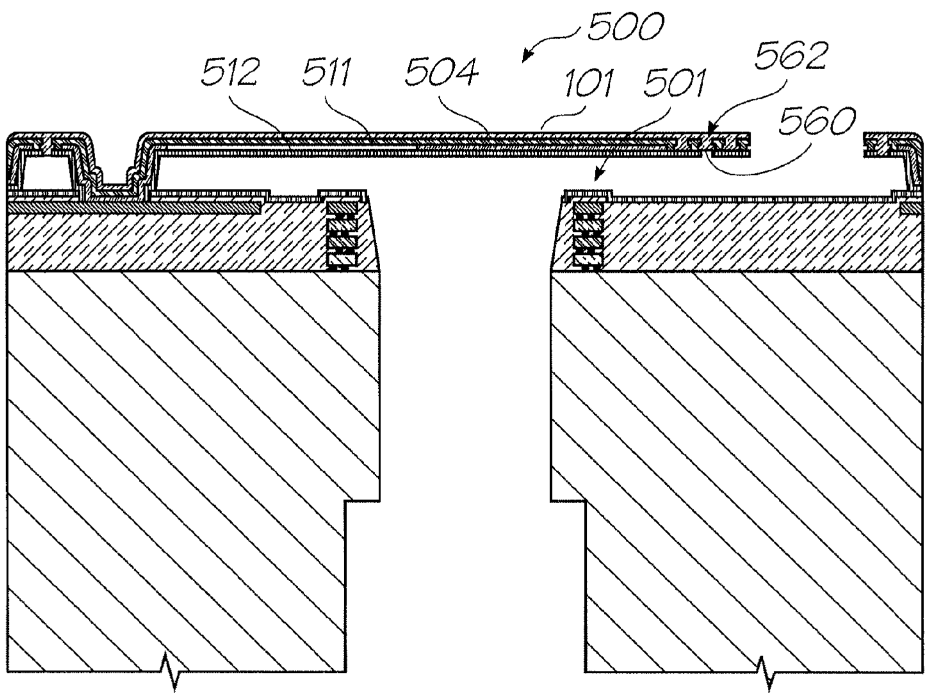
FIG. 35 shows the nozzle assembly of FIG. 31 with a polymeric coating on the roof forming a mechanical seal between a moving roof portion and a static roof portion.
Figure 36:
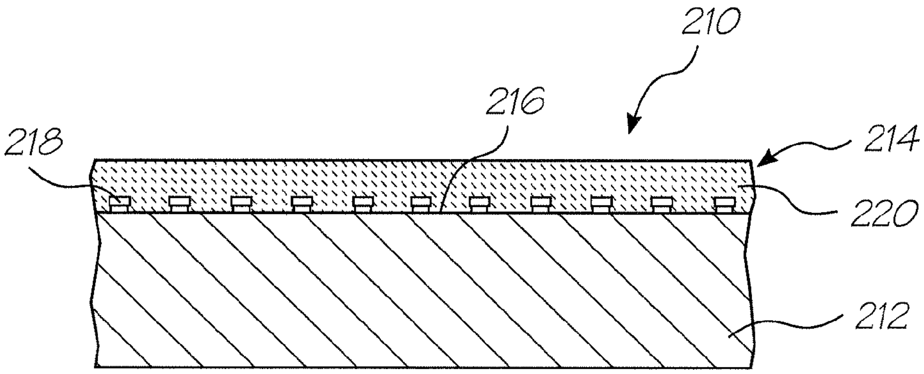
FIG. 36 shows a wafer assembly having a plurality of nozzles protected by a protective layer.

FIG. 35 shows the nozzle assembly 500 with a hydrophobic polymer coating 101. By analogy with the nozzle assembly 400, it will be appreciated that by sealing the gap 560 with the polymer 101, a mechanical seal 562 is formed which provides excellent mechanical sealing of ink in the nozzle chamber 501.

Streamlined Backside MEMS Processing

Hitherto, the Applicant has described how backside MEMS processing of a printhead wafer may be performed (see, for example, U.S. Pat. No. 6,846,692, the contents of which is incorporated herein by reference). During backside MEMS processing, the backside of the wafer is ground to provide a desired wafer thickness (typically 100 to 300 microns) and ink supply channels are etched from a backside of the wafer so as to form a fluidic connection between the backside, which receives ink, and the nozzle assemblies. In addition, backside MEMS processing may define dicing streets in the wafer so that the wafer can be separated into individual printhead integrated circuits. Typically, backside MEMS processing is performed after completion of all frontside MEMS fabrication steps, in which nozzle assemblies are constructed on the frontside of the wafer.

FIGS. 36 to 45 outline typical backside MEMS processing steps, as described in U.S. Pat. No. 6,846,692. In an initial step, illustrated at 210 in FIG. 36, a silicon wafer 212 is provided having a frontside 216 on which is formed a plurality of MEMS nozzle assemblies 218 in a MEMS layer 214. The MEMS nozzle assemblies 218 are typically of the form shown in FIGS. 10 and 11, in which the nozzle assembly is fully formed with the exception of sacrificial material 10 and 16 filling nozzle chambers.

A protective layer 220 is interposed between the nozzle assemblies 218. This protective layer 220 is typically a relatively thick layer (e.g. 1 to 10 microns) of sacrificial material, such as photoresist, which is spun onto the frontside 216 after fabrication of the MEMS nozzle assemblies 218. The photoresist is UV cured and/or hardbaked to provide a rigid and durable protective coating that is suitable for attachment to a glass handle wafer.

Figure 37:
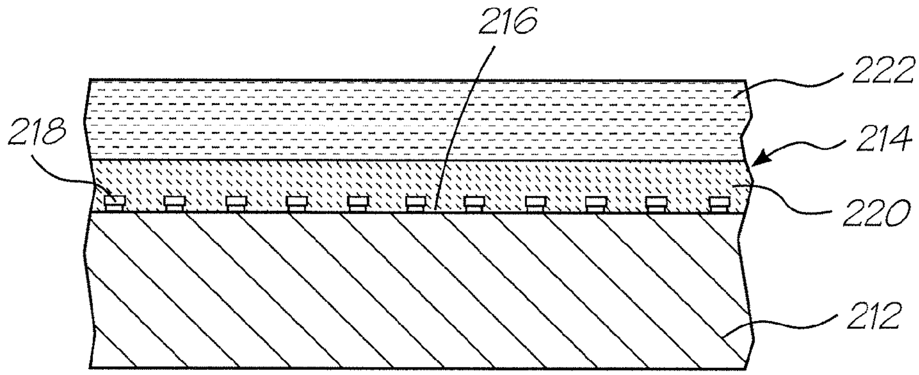
FIG. 37 shows the wafer assembly of FIG. 36 after attachment of an adhesive tape to the protective layer.
Figure 38:
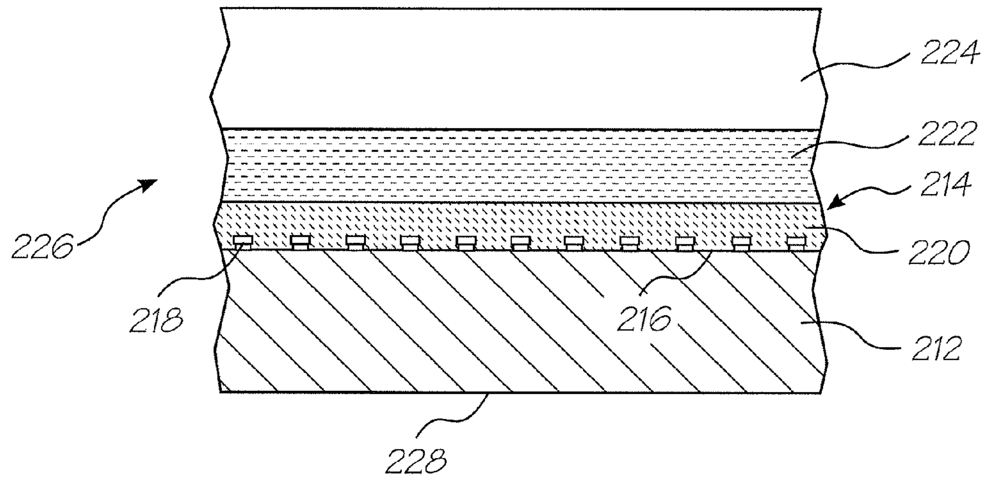
FIG. 38 shows the wafer assembly of FIG. 37 after attachment of a handle wafer to the adhesive tape.

A first holding means, in the form of an adhesive tape 222, is bonded to the MEMS layer 14 as illustrated in FIG. 37. The tape 222 is bonded to the layer 214 by means of a curable adhesive. The adhesive is curable in the sense that it loses its adhesive properties or "tackiness" when exposed to ultraviolet (UV) light or heat. The tape 222 described in the specific embodiment described herein is a UV-release tape, although it will be appreciated that thermal-release tapes may be equally suitable for use as the first holding means.

Depending on the equipment used, a handling means in the form of a glass, quartz, alumina or other transparent handle wafer 224 is secured to the tape 222.

A laminate 226, comprising the silicon wafer 212 with MEMS layer 214, the tape 222 and the glass wafer 224 is then turned over to expose an opposed backside 228 of the wafer.

Figure 39:
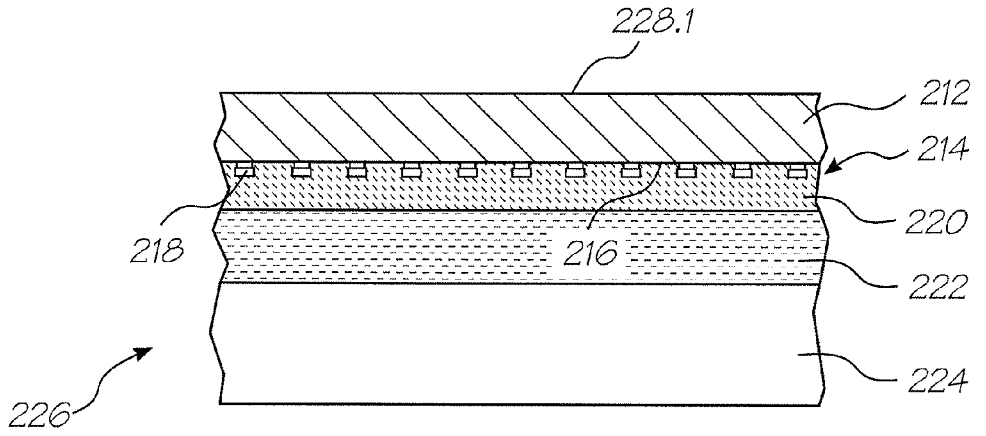
FIG. 39 shows the wafer assembly of FIG. 38 flipped for backside processing.

A first operation is performed on the backside 228 of the silicon wafer 212 by backgrinding a surface 228.1 to thin the wafer 12, as illustrated in FIG. 39. This reduces subsequent etch times for etching dicing streets and ink supply channels in the wafer 12.

Figure 40:
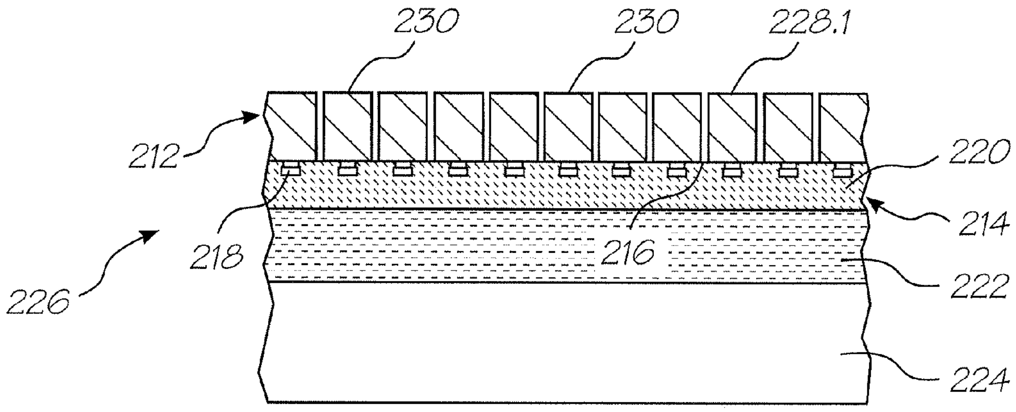
FIG. 40 shows the wafer assembly of FIG. 39 after backside processing, which includes defining dicing streets in the wafer.

Then, as shown in FIG. 40, the silicon wafer 212 is deep silicon etched through the wafer from the backside 228 to dice the wafer 212 and form individual integrated circuits or chips 230. In FIG. 40, each chip 230 has only one MEMS nozzle assembly 218 associated, although it will be appreciated that each chip 230 typically contains an array (e.g. greater than 2000) nozzle assemblies arranged in rows.

At the same time as etching dicing streets from the backside 228 of the wafer 212, ink supply channels may also be etched so as to provide a fluidic connection to each nozzle assembly 218.

Figure 41:
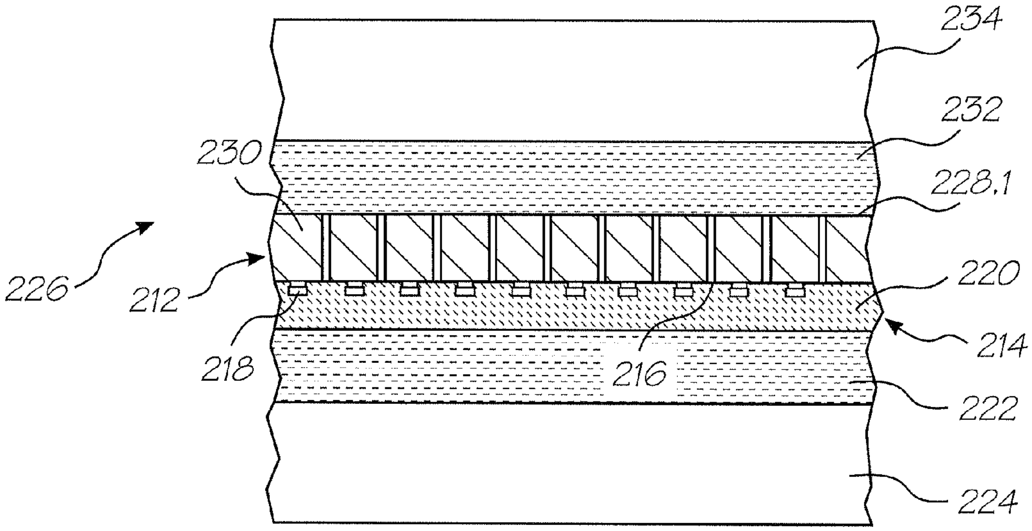
FIG. 41 shows the wafer assembly of FIG. 40 after attachment of a backside handle wafer using an adhesive tape.
Figure 42:
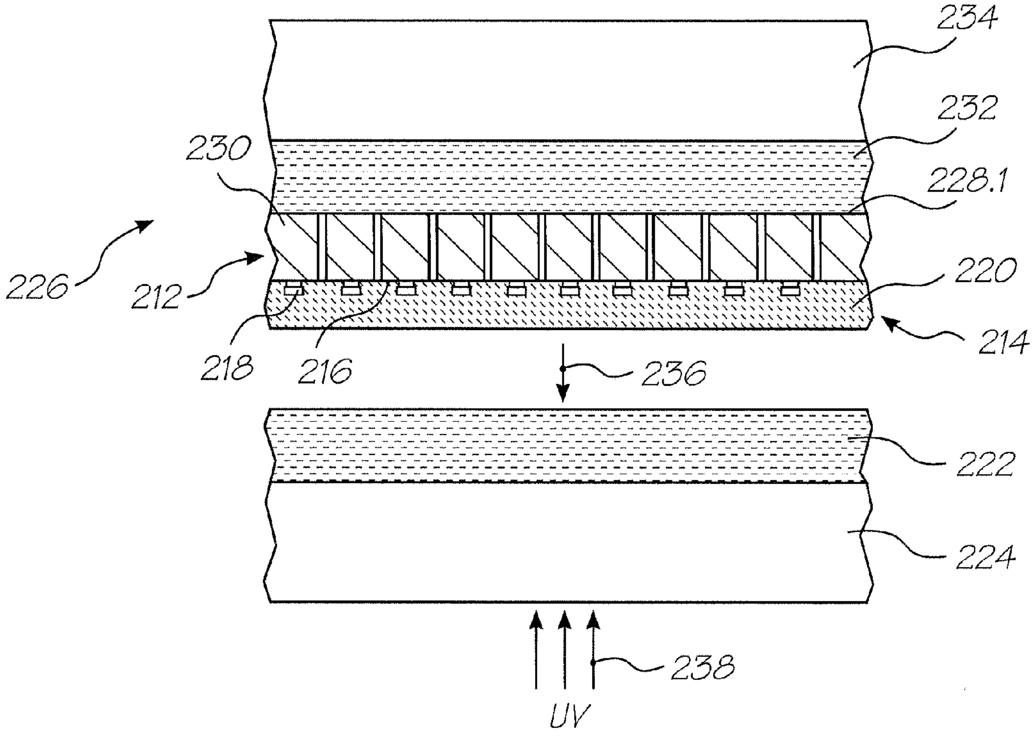
FIG. 42 shows the wafer assembly of FIG. 41 after releasing the frontside handle wafer and tape.
Figure 43:
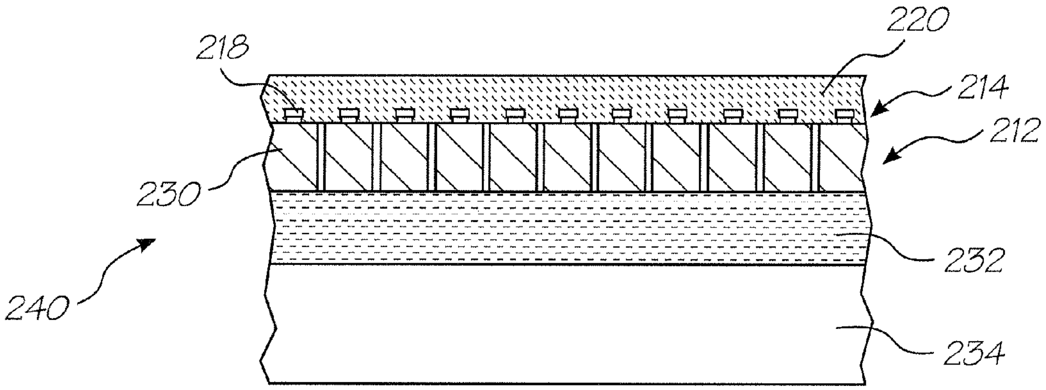
FIG. 43 shows the wafer assembly of FIG. 42 flipped.

Following backside etching, and as shown in FIG. 41, a second holding means in the form of a second tape 232 is applied to the backside surface 228.1 of the wafer 212. A second transparent handle wafer 234 is applied to the tape 232, depending on the equipment being used. The tape 232 is bonded to the surface 228.1 of the wafer 212 by means of an adhesive which is also curable when exposed to UV light or heat.

After attachment of the second handle wafer 234, the first tape 222 and the glass wafer 224 are removed, as illustrated schematically by arrow 236 in FIG. 7. The tape 222 is removed by exposing it to UV light which is projected on to the tape 222 through the glass layer 224 as illustrated by arrows 238. It will be appreciated that the glass wafer 224 is transparent to the UV light. In contrast, the silicon wafer 212 is opaque to the UV light so that the tape 232 on the other side of the wafer 212 is not affected by the UV light when the tape 222 is exposed to the UV light.

Once the tape 222 and glass wafer 224 have been removed, a new laminate 240, comprising the silicon wafer with MEMS layer 214, the tape 232 and the glass wafer 234 is turned over to expose the protective layer 220.

The protective layer 220 is then removed by ashing in an oxygen plasma. This releases the MEMS nozzle assemblies 218, and completes the separation of the chips 242. At the same time as removing the protective layer 220, any other exposed sacrificial material, which remained from frontside MEMS fabrication, is also removed. For example, the sacrificial material 10 and 16 shown in FIGS. 10 and 11 may be removed at this stage.

Figure 45:
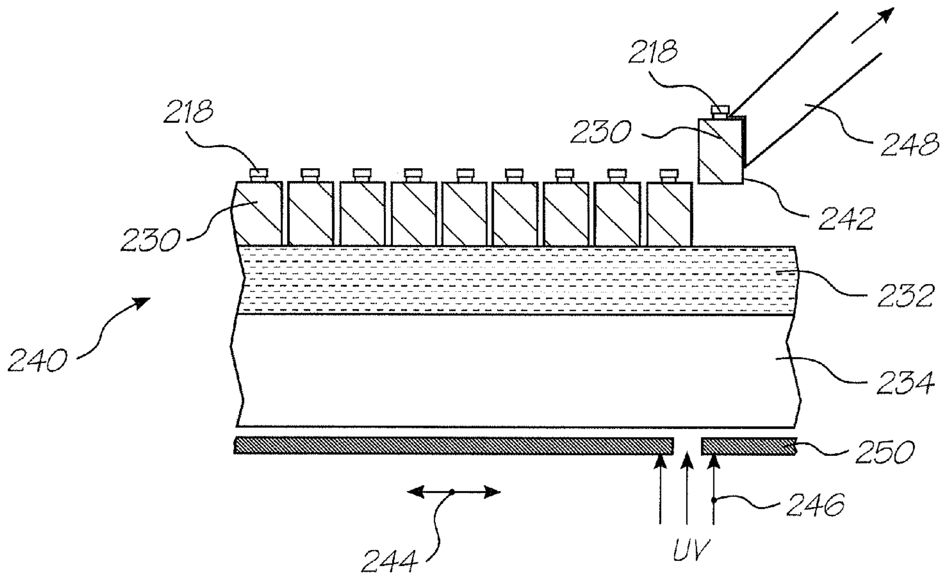
FIG. 45 shows the wafer assembly of FIG. 44 with individual chips being removed.

The laminate 240 is placed on an xy wafer stage (not shown) which is reciprocated, as illustrated by arrow 244 in FIG. 45. Each MEMS chip 242, when it is desired to remove it, is exposed to UV light as indicated by arrows 246 through a mask 250. This cures the adhesive of the tape 232 locally beneath one particular MEMS chip 242 at a time, to enable that MEMS chip 242 to be removed from the tape 232 by means of a transporting means which may include a vacuum pickup 248. The MEMS chips 242 can then be packaged and/or formed into a printhead by butting a plurality of chips together.

A disadvantage of the backside MEM processing steps described previously, and outlined herein, is that it is necessary to apply a protective layer 220 to the nozzle assemblies before attaching the first tape 222 and first handle wafer 224. This protective layer 220 must be subsequently removed by an oxidative plasma (ashing). Due to the thickness and constitution of this hardbaked protective layer, ashing times are relatively long.

It is generally desirable to minimize the number of MEMS processing steps. It is further desirable to shorten as far as possible the processing time in each step. It is further desirable to minimize the risk of damage to MEMS nozzle structures by avoiding extended ashing times.

Figure 44:
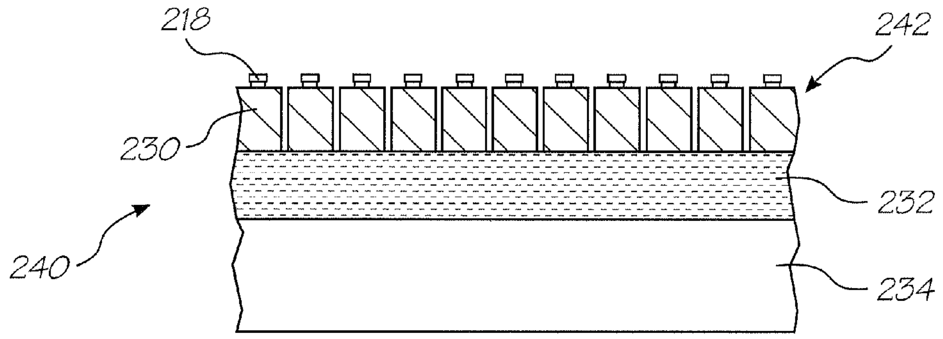
FIG. 44 shows the wafer assembly of FIG. 43 after ashing the protective layer.
Figure 46:
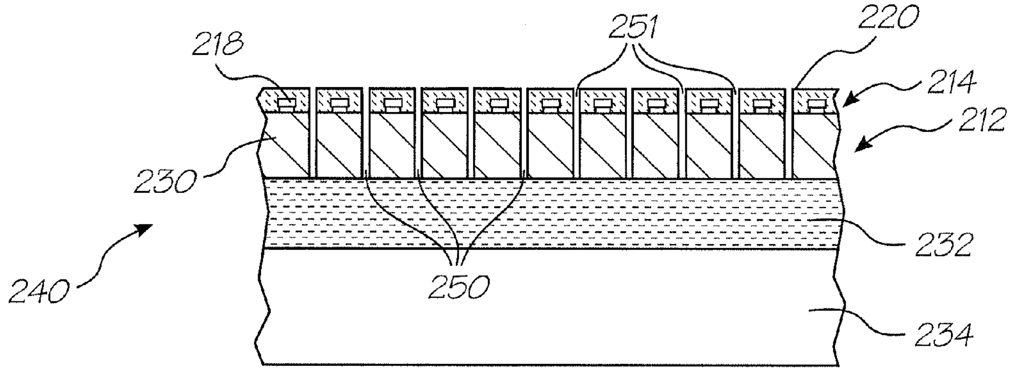
FIG. 46 shows an assembly in which individual chips having a polymer coating are ready for removal from a backside handle wafer.
Figure 47:
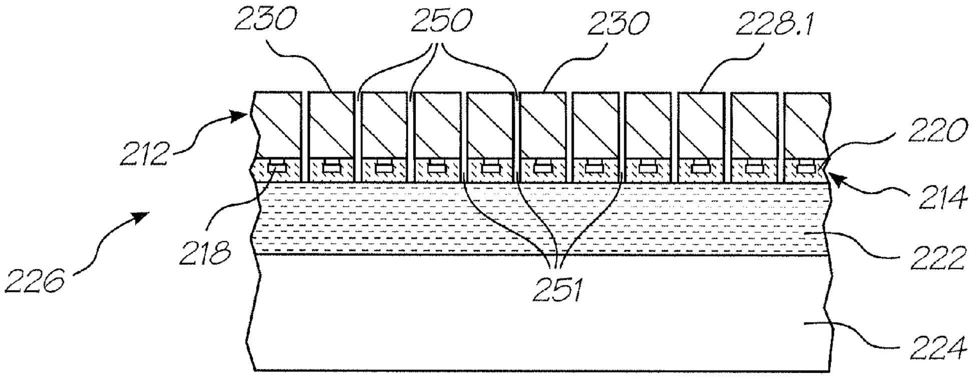
FIG. 47 shows an assembly in which individual chips having a polymer coating are ready for removal from a frontside handle wafer.

Referring again to FIG. 36, it can readily be seen that the polymer 100 described above may take the place of the sacrificial material used as the protective layer 220. The skilled person will understand that the protective layer 220 throughout FIGS. 36 to 43 may be formed of the polymer 100. However, instead of being removed before chip separation, as shown in FIG. 44, the polymer 100 remains on the ink ejection face of each chip. Frontside dicing streets 251 are defined in the polymer 100 prior to any backside processing (typically by photopatterning at the same time as defining nozzle openings through the polymer 100—see FIG. 21 or FIG. 25). The frontside dicing streets 251 allow the chips to be separated with their respective polymer coatings once backside dicing streets 250 have been defined during backside processing. FIG. 46 shows an assembly in which individual MEMS chips 242, having a protective layer 220 comprised of the polymer 100, are ready for removal from the second handle wafer 234. FIG. 47 is analogous to the stage shown at FIG. 43.

Alternatively, the use of the second handle wafer 234 may be avoided altogether. The individual MEMS chips 242 may be removed directly from the assembly shown in FIG. 47, which is analogous to the stage shown at FIG. 40. As shown in FIG. 47, the chips 230 are releasably attached to the first handle wafer 224 and all backside MEMS processing steps have been completed.

In this way, the polymer 100 may perform the multiple functions of providing a hydrophobic ink ejection face; providing a mechanical seal for thermal bend-actuated nozzles; and providing a protective coating onto which the handle wafer 224 may be attached, using the adhesive tape 222. Thus, the polymer 100 may be used to facilitate backside MEMS processing steps, as described above.

The use of the hydrophobic polymer described above advantageously streamlines backside MEMS processing by way of reducing the number of steps and shortening ashing times. Furthermore, the use of the polymer 100 enables greater flexibility as to when ashing is performed in the overall process flow. Since the polymer 100 is not sacrificial, the process flow is not dictated by removal of the layer 220 in a late-stage frontside ashing step. When using the polymer 100, backside ashing of sacrificial material 10 and 16 is equally feasible.

It will be appreciated by ordinary workers in this field that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of fabricating a plurality of MEMS integrated circuits from a wafer having a MEMS layer formed on a frontside thereof and a polymer coating over said MEMS layer, said polymer coating having a plurality of frontside dicing streets defined therethrough, said method comprising the steps of:

(a) releasably attaching a first holding means to said polymer coating; and (b) performing at least one operation on a backside of the wafer, said at least one operation including etching a plurality of backside dicing streets through the wafer, each backside dicing street meeting with a respective frontside dicing street, thereby providing the plurality of MEMS integrated circuits releasably attached to said first holding means, wherein each MEMS integrated circuit comprises a respective polymer coating, said polymer coating being comprised of a polymerized siloxane.

2. The method of claim 1, wherein said polymer coating is resistant to removal by an oxidative plasma.

3. The method of claim 1, wherein said polymer coating is hydrophobic.

4. The method of claim 1, wherein the polymer coating has a Young's modulus of less than 1000 MPa.

5. The method of claim 1, wherein said polymer coating is photopatternable.

6. The method of claim 1, wherein the polymer coating is comprised of polydimethylsiloxane (PDMS).

7. The method of claim 1, wherein said MEMS layer comprises a plurality of inkjet nozzle assemblies, and said method provides a plurality of printhead integrated circuits.

8. The method of claim 1, wherein said first holding means is releasably attached by means of an adhesive tape.

9. The method of claim 1, wherein said first holding means is a handle wafer.

10. The method of claim 1, further comprising the step of removing said integrated circuits from said first holding means.

11. The method of claim 1, comprising the further steps of:

(c) releasably attaching a second holding means to said backside of the wafer; and (d) removing the first holding means to provide the plurality of MEMS integrated circuits releasably attached to said second holding means.

12. The method of claim 1, wherein said frontside is subjected to said oxidative plasma after step (d).

13. The method of claim 11, wherein said second holding means is selected from the group comprising: a handle wafer and a wafer film frame.

14. The method of claim 2, which includes the step of subjecting said wafer to an oxidative plasma for removing sacrificial material in the MEMS layer.

15. The method of claim 7, wherein said polymer coating has a plurality of nozzle openings defined therethrough, each of said nozzle openings being aligned with a nozzle opening of a respective inkjet nozzle assembly.

16. The method of claim 7, wherein step (b) comprises performing at least one operation selected from the group comprising:

backside wafer thinning;

backside etching of ink supply channels to provide a fluidic connection between said backside and said inkjet nozzle assemblies; and subjecting said backside to an oxidative plasma.

17. The method of claim 8, wherein said adhesive tape is a UV release tape or a thermal release tape.

18. The method of claim 16, wherein said backside wafer thinning comprises one or more of:

wafer grinding; and plasma etching.

19. A method of fabricating a plurality of MEMS integrated circuits from a wafer having a MEMS layer formed on a frontside thereof, said method comprising the steps of:

(a) applying a polymer coating over said MEMS layer;

(b) defining a plurality of frontside dicing streets through said polymer coating;

(c) releasably attaching a first holding means to said polymer coating; and (d) performing at least one operation on a backside of the wafer, said at least one operation including etching a plurality of backside dicing streets through the wafer, each backside dicing street meeting with a respective frontside dicing street, thereby providing the plurality of MEMS integrated circuits releasably attached to said first holding means, wherein each MEMS integrated circuit comprises a protective polymer coating, said polymer coating being comprised of a polymerized siloxane.

20. A method of fabricating a plurality of MEMS integrated circuits from a wafer having a MEMS layer formed on a frontside thereof and a polymer coating over said MEMS layer, said polymer coating having a plurality of frontside dicing streets defined therethrough, said method comprising the steps of:

(a) releasably attaching a first holding means to said polymer coating; and (b) performing at least one operation on a backside of the wafer, said at least one operation including etching a plurality of backside dicing streets through the wafer, each backside dicing street meeting with a respective frontside dicing street, thereby providing the plurality of MEMS integrated circuits releasably attached to said first holding means, wherein each MEMS integrated circuit comprises a respective polymer coating, said polymer coating being comprised of perfluorinated polyethylene (PFPE).

21. A method of fabricating a plurality of MEMS integrated circuits from a wafer having a MEMS layer formed on a frontside thereof, said method comprising the steps of:

(a) applying a polymer coating over said MEMS layer;

(b) defining a plurality of frontside dicing streets through said polymer coating;

(c) releasably attaching a first holding means to said polymer coating; and (d) performing at least one operation on a backside of the wafer, said at least one operation including etching a plurality of backside dicing streets through the wafer, each backside dicing street meeting with a respective frontside dicing street, thereby providing the plurality of MEMS integrated circuits releasably attached to said first holding means, wherein each MEMS integrated circuit comprises a protective polymer coating, said polymer coating being comprised of perfluorinated polyethylene (PFPE).

* * * * *